US006784042B2

(12) United States Patent
Salvatore

(10) Patent No.: US 6,784,042 B2
(45) Date of Patent: Aug. 31, 2004

(54) INTEGRATION PROCESS ON A SOI SUBSTRATE OF A SEMICONDUCTOR DEVICE COMPRISING AT LEAST A DIELECTRICALLY ISOLATED WELL

(75) Inventor: Leonardi Salvatore, Aci S. Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/033,694

(22) Filed: Dec. 28, 2001

(65) Prior Publication Data

US 2002/0146867 A1 Oct. 10, 2002

(30) Foreign Application Priority Data

Dec. 29, 2000 (EP) .......................................... 00830870

(51) Int. Cl.[7] ........................................... H01L 21/762
(52) U.S. Cl. ...................... 438/207; 438/404; 438/432
(58) Field of Search ................................ 438/164–219, 438/295, 404, 406, 432, 667, 684, FOR 222, FOR 351

(56) References Cited

U.S. PATENT DOCUMENTS

| | | | | |
|---|---|---|---|---|
| 4,477,310 A | * | 10/1984 | Park et al. ................... | 438/301 |
| 4,700,464 A | * | 10/1987 | Okada et al. ................ | 438/296 |
| 5,141,888 A | * | 8/1992 | Kawaji et al. ............... | 438/361 |
| 5,356,822 A | * | 10/1994 | Lin et al. .................... | 438/154 |
| 5,407,841 A | * | 4/1995 | Liao et al. ................... | 438/202 |
| 5,416,041 A | * | 5/1995 | Schwalke .................... | 438/404 |
| 5,442,223 A | | 8/1995 | Fujii | |
| 5,480,832 A | * | 1/1996 | Miura et al. ................. | 438/404 |
| 5,569,621 A | * | 10/1996 | Yallup et al. ................ | 438/404 |
| 5,599,722 A | * | 2/1997 | Sugisaka et al. ............ | 438/406 |
| 5,607,875 A | | 3/1997 | Nishizawa et al. | |
| 5,914,523 A | | 6/1999 | Bashir et al. | |
| 6,071,803 A | * | 6/2000 | Rutten et al. ................ | 438/618 |
| 6,121,661 A | * | 9/2000 | Assaderaghi et al. ....... | 257/355 |
| 2002/0027245 A1 | * | 3/2002 | Noguchi ...................... | 257/345 |
| 2002/0158270 A1 | * | 10/2002 | Yamamoto et al. .......... | 257/200 |

FOREIGN PATENT DOCUMENTS

EP 0451454 10/1991

OTHER PUBLICATIONS

Wolf S. "Silicon Processing for the VLSI–ERA: vol. 2–Process Integration", 1990, Lattice Pr., vol. 2, pp. 20–24.*
R. Jerome et al., "The Effect of Trench Processing Conditions on Complementary Bipolar Analog Devices with SOI/Trench Isolation," IEEE 1993 Bipolar Circuits and Technology Meeting 3.2:pp. 41–44, 1993.
Makoto Yoshida et al., "A Bipolar–Based 0.5 μm BiCMOS Technology on Bonded SOI for High–Speed LSIs," IEICE Transaction on Electronics E77–C(8):1395–1402, 1994.

* cited by examiner

Primary Examiner—George Fourson
(74) Attorney, Agent, or Firm—Eisa K. Jorgenson; E. Russell Tarleton; Seed IP Law Group PLLC

(57) ABSTRACT

An integration process in a SOI substrate of a semiconductor device having at least a dielectrically insulated well, the process including: an oxidizing step directed to form an oxide layer; a depositing step of a nitride layer onto the oxide layer; a masking step, carried out onto the nitride layer using a resist layer and directed to define suitable photolithographic openings for forming at least one dielectric trench effective to provide side insulation for the well; an etching step of the nitride layer and oxide layer, as suitably masked by the resist layer, the nitride layer being used as a hardmask; a step of forming the at least one dielectric trench, which step comprises at least one step of etching the substrate, an oxidizing step of at least sidewalls of the at least one dielectric trench, and a step of filling the at least one trench with a filling material; and a step of defining active areas of components to be integrated in the well, being carried out after the step of forming the at least one dielectric trench.

41 Claims, 33 Drawing Sheets

Bonded Si                    Bonded Si

INTEGRATION PROCESS ON A SOI SUBSTRATE OF A SEMICONDUCTOR DEVICE COMPRISING AT LEAST A DIELECTRICALLY ISOLATED WELL

BACKGROUND OF THE INVENTION

1. Field of the Invention

This invention relates to an integration process in a SOI substrate of a semiconductor device comprising at least a dielectrically insulated well.

The invention relates, particularly but not exclusively, to a process for integrating a BiCMOS technology device in a SOI (Silicon-On-Insulator) substrate.

2. Description of the Related Art

As it is well known, full electrical insulation for one or more devices may be obtained, for example, by integrating a dielectric trench insulating structure so as to create one or more isolation wells wherein such devices can be formed.

Particularly with devices made in SOI substrates, which devices are characterized by a BOX (Buried OXide) layer providing vertical insulation, a dielectric trench side insulating structure is specifically provided for lateral insulation only.

Thus, continuity from the buried oxide layer to the dielectric trench side insulating structure ensures dielectric insulation of devices integrated in the SOI substrates and formed in suitable wells, known as isolation wells, which are surrounded by the BOX layer and the dielectric trench side insulating structure.

Shown schematically in FIG. 1 is a portion 1 of a semiconductor device that includes essentially a dielectrically insulated well 2 according to the prior art.

In particular, the semiconductor device portion 1 includes a substrate region 3, also known as the handle-wafer, which usually provides mechanical support. Where complex devices are integrated, it also serves as an active silicon layer.

Formed onto the substrate region 3 is a buried oxide (BOX) layer 4 which is used for vertical insulation of the well 2, side insulation thereof being provided by means of a side oxidized region that is covered by a nitride layer 6 and is provided at the edges of the well 2 in dielectric contact with the buried oxide layer 4.

In particular, the combination of two side oxidized regions 5 with their nitride layers 6, and the underlying portion of the buried oxide layer 4, forms a so-called dielectric trench insulating structure 7 which is usually filled with a filling material 8, usually polysilicon.

The dielectric trench insulating structure 7 defines, inside the well 2, an integration region 9 (device-wafer) for a variety of components that are thus isolated from the remainder of the semiconductor device.

The surface of the semiconductor device portion 1 should be sufficiently planar to allow the other layers required for integrating components of interest in the well 2 to be grown or deposited. The involved layers may be photoresist, nitride, vapox, oxide, metallization or other layers, for example.

It should be noted here that processes of etching and depositing mutually selective layers are necessary to produce the side insulation, as well as for the planarizing step.

For example, silicon etching to form the dielectric trench insulating structure 7 is to be carried out selectively with respect to the surface layers (such as oxide and/or nitride layers). In particular the presence of the buried oxide layer 4, typical of SOI substrates, makes a complicated process sequence necessary to avoid etching away or damaging the layer 4 during any of the processing steps required to form the electrically isolated well 2.

From U.S. Pat. No. 5,811,315 to W. Yindeepol et al., a method of forming dielectric trench insulating structures in SOI substrates is known, which comprises, in particular, a process sequence for integrating and planarizing deep trenches, and is directed to leave the thickness of a field oxide, preliminarily grown over the silicon wafer surface, unaffected.

Reference will be made now to FIGS. 2A to 2O for a description of this known process sequence.

Starting with a SOI substrate 13 formed onto a conventional substrate 11, and a buried oxide layer 12 (as shown schematically in FIG. 2A), the following layers are formed in this order: a thick oxide layer 14 (also known as field oxide), being grown preliminarily over the silicon surface of the substrate 13; a silicon nitride layer 15, being deposited onto said field oxide 14; and a (VAPOX or TEOS) deposited oxide layer 16, acting as a hardmask, which is deposited onto the previously formed layer 15 of silicon nitride.

The silicon nitride layer 15 is used, in particular, to avoid etching the field oxide 14 away during the step of removing the hardmask layer 16, as later provided after a dielectric insulating trench 17 is formed.

The hardmask layer 16 is purposely coated with a resist layer 18 (as shown schematically in FIG. 2B), and appropriate openings are formed to the same width as the dielectric trenches 17 to be formed, using photolithographic processes well known to the skilled persons in the art. A step is then carried out of dry etching the layers 16, 15 and 14, the etchant chemistry for these layers being selective with respect to the substrate 13.

Thereafter, the resist layer 18 is removed, and the substrate 13 is dry etched down to the buried oxide layer 12 to form the dielectric trench 17 (as shown schematically in FIG. 2C).

To remove crystal damages caused during this etching step along the walls of the dielectric trench 17, a thin oxide layer 19, known as sacrificial oxide, is grown and subsequently removed (as shown schematically in FIGS. 2D and 2E). The thin sacrificial oxide layer 19 is etched using a HF solution. This etching should not be applied for too long, overetching of the buried oxide layer 12 and the field oxide 14 being thus avoided.

A sidewall oxidation process to grow an oxide layer 20 along the sidewalls of the dielectric trench 17 (as shown schematically in FIG. 2F), and a depositing step of a nitride layer 21 all over the surface of the semiconductor device (as shown schematically in FIG. 2G), are then carried out.

The nitride layer 21 is next etched away, anisotropically and selectively with respect to the buried oxide layer 12, but allowed to stay on the sidewall surfaces of the dielectric layer 17 in order to form so-called spacers in contact with the silicon nitride layer 15 (as shown schematically in FIG. 2H). The nitride layer 21 is instead removed from over the hardmask layer 16 and from the bottom of the dielectric trench 17.

It should be noted that the deposition of the nitride layer 21 is also directed to prevent etching through the field oxide 14 as the hardmask layer 16 is removed. For the purpose, the thickness of the hardmask layer 16 is originally selected to ensure that a vertical-wall portion of it will survive the various etching steps and provide good covering of the spacer formed by nitride layer 21, which will serve to keep the side regions of the field oxide 14 intact (as shown schematically in FIG. 2I).

This means that, during the process operations between the two nitride depositions, HF etchings will be applied to remove any residual oxynitride 22 from the interface of the two nitride layers (15 and 21), as shown schematically in FIG. 2J.

Following a step of anisotropically removing the nitride layer 21, the resulting trench 23 is filled with a filling material 24, specifically a polysilicon filling material (as shown schematically in FIG. 2K).

Thereafter, the polysilicon filling material 24 is removed from the surface, which is an endpoint with respect to the hardmask layer 16 (etching back step), thereby to leave some polysilicon 24 inside the trench 23 (as shown schematically in FIG. 2L). At this stage, the polysilicon filling material 24 is overetched slightly so that the following cap oxidizing step can be planar with respect to the field oxide 14.

After this etching back step of the polysilicon filling material 24, the hardmask layer 16 leftover is removed. It is therefore important to have a robust interface provided between the nitride regions 15 and 21 that is capable of withstanding the protracted exposure to the etchant involved in the removal of the hardmask layer 16.

It should be noted that the hardmask layer 16 is not to be removed before the polysilicon filling material 24 is deposited into the trench 23. Otherwise, the buried oxide layer 12 would be removed with it, since, at this stage, the bottom of the trench 23 is not protected by any nitride layer, and the required vertical dielectric insulation of the trench 23, and hence of the well 2, is missing.

Furthermore, even with the polysilicon filling material 24 in the trench 23, a nitride layer 21 would still be necessary to provide side spacers and prevent an etching of the hardmask layer 16 from intruding also into the field oxide 14 (as shown schematically in FIG. 2M).

After removal of the hardmask layer 16, the whole surface of the semiconductor device, excepting the polysilicon filling material 24, will be covered with silicon nitride (layers 15 and 21). An oxidizing step is then carried out to oxidize and plug up dielectrically the polysilicon filling material 24 in the trench 23, thus forming the so-called cap oxide 25 (as shown schematically in FIG. 2N).

At this point, the silicon nitride of the layers 15 and 21 is removed, to leave the well 2 sides insulated dielectrically by the trench 23 thus obtained (as shown schematically in FIG. 2O). The combination of the trench 23 and the buried oxide layer 12 in mutual contact form the dielectric insulation of the well 2.

It thus becomes possible to go through further processing steps and integrate a number of devices in such a well 2, now dielectrically insulated.

Although achieving its object of providing a dielectrically insulated well in a SOI substrate, the above known solution involves a long and complicated procedure, and has technological limitations which demand compromise processing. Particularly overetching, when removing the silicon nitride layer 15, may cause structural problems in the trench 23, as shown schematically in FIGS. 3A and 3B as noted by the pair of arrows.

These problems can be obviated by dry etching, rather than wet etching, the silicon nitride layer 15. In practice, this choice may result in a thin layer 26 of so-called pad oxide becoming damaged which would be present in the active regions of the semiconductor device where no thick field oxide 14 is provided (as shown schematically in FIG. 3C). Before this dry etching can be applied to the silicon nitride layer 15, the pad oxide 26 must be removed and a better quality oxide grown instead, which further lengthens the process sequence.

Also, the thickness of the hardmask layer 16 would exit the etching step for forming the trench 23 with uneven spots.

Finally, the trench 23 must be filled before the hardmask layer 16 is removed, to avoid etching away the buried oxide layer 12. This process limitation introduces some problems to the step of etching back the polysilicon filling material 24. Controlling the planarity of the semiconductor device surface near the trench 23 after said step of etching back the polysilicon filling material 24, is made difficult (as shown schematically in FIGS. 4A and 4B) because the depth to which the polysilicon filling material 24 is etched inside the trench 23 is proportional to the thickness of the hardmask layer 16, and the thickness of the hardmask layer 16 shows unevenness after the etching of the trench 23.

Also described in the aforementioned US patent is an alternative process for removing the hardmask layer 16 before the step of filling the trench 23 with the polysilicon filling material 24, without etching away the buried oxide layer 12.

After completing the process steps just described up to the depositing step of the nitride layer 21, a dry etching step is carried out with different pressure and power parameters with respect to the previous embodiment, so as to retain a residual amount 21* of nitride on the bottom of the trench insulating structure (as shown schematically in FIGS. 5A and 5A-1).

Presently, the hardmask layer 16 is removed, and the steps of depositing, etching back and oxidizing the polysilicon filling material 24 are carried out similarly as in the above-described process sequence (as shown schematically in FIGS. 5B to 5E), the nitride layer 15 is removed, and a trench 23 is thus completed with residual nitride 21* left on the trench bottom (as shown schematically in FIG. 5F).

A first embodiment of the trench 23, shown schematically in FIGS. 6A to 6E, is also described wherein the nitride layer 15 is removed initially to also take away corner edges 27. Thereafter, another nitride layer 28 is grown which conforms with the underlying structure, and the structure is completed by the previously described process steps.

A second embodiment of the known trench 23', shown schematically in FIGS. 7A to 7E, can be obtained by removing the nitride layer 15 and depositing the polysilicon filling material 24 directly, the structure being completed by the previously described process steps.

The alternative embodiments shown in FIGS. 5A to 5F, and 6A to 6E, provide trench insulating structures which have no nitride layers inside the trenches, thus eliminating the risk of this internal layer of nitride causing stresses and flaws to appear in the SOI substrate next to the trench walls.

In these alternative embodiments, however, the selectivity of some processing steps with respect to others is critical, and calls for a complicated and variously compromised process sequence.

In particular, and as indicated in the aforementioned patent, the buried oxide layer 12 typical of SOI substrates must be protected during the etching steps to form the trench 23.

In addition, the trench 23 is formed after the field oxide 14 is grown, that is after defining the active areas of the components. This requires that the thickness of the field oxide 14 be preserved during the etching steps necessary to form the trench 23.

The above limitations to the process call for depositions of at least two nitride layers, and create problems of selectivity in connection with the required etchings to integrate the trench 23 as well as protect the field oxide 14.

Forming a trench of insulating structure 23 as taught in the aforementioned patent, in accordance with the main process flow and its alternative embodiments, involves long and complicated processing steps, and places constraints on the fabrication of the semiconductor device as a whole.

Integrating dielectrically insulated structures in SOI substrates has a further problem in the quality of the side insulation provided for the well by the trench insulating structure.

For example, the development of flaws from mechanical stress in the silicon regions which surround the trench insulating structure, or the silicon regions near the corners of the well defined by such a structure, where the trench is contacting the buried oxide layer, may lead to leakage, early breakdown, or breakdown instability, especially at high operating voltages of the well.

To remove this critical factor, it has been known to bias the polysilicon trench filling material 24 so as to maintain a stable electrical isolation of the components integrated in the various isolation wells of the wafer. This bias method involves, however, changes to the structure and the process previously described.

Methods of biasing the polysilicon filling material of a dielectric trench consistent with SOI substrate technologies are described in U.S. Pat. No. 5,914,523 to R. Bashir et al., and U.S. Pat. No. 6,071,803 to M. J. Rutten et al., for example.

In particular, the above-mentioned first patent describes a process for obtaining a metallization trench that is partly insulated dielectrically and allows top-bottom contact of the silicon regions located in the handle-wafer and in the device-wafer, in order to overcome problems of integration of ESD structures in dielectrically insulated technologies.

The resulting structure is in contact with the trench filling material, thereby overcoming the problems of unstable insulation mentioned above.

The above-mentioned second patent describes a process for obtaining a trench insulating structure in a SOI substrate. In particular, the process sets out from a trench 23 (FIG. 2N) obtained in accordance with the first patent, and comprises an oxidizing step of the polysilicon filling material 24 of the trench (as shown schematically in FIG. 8A), which results in a nitride layer 29 being formed.

The nitride layer 29 and a portion of the nitride layer 21 are then etched away to leave a side portion 30 of polysilicon exposed (as shown schematically in FIG. 8B).

The exposed polysilicon side portion 30 is 0.5 micron at the deepest.

A further layer 31 of polysilicon is then deposited onto the entire surface of the semiconductor device to cover the formed trench (as shown schematically in FIG. 8C).

It should be noted that the polysilicon layer 31 will be contacting the polysilicon filling material 24 through the exposed polysilicon side portion 30, the depositing step being self-aligned and requiring no additional masking.

Briefly, the bias contact to the trench polysilicon filling material 24 is established by a second polysilicon layer 31, the latter being optionally useful to contact active regions of the components as well.

All of the conventional trench insulating structures in a SOI substrate described hereinabove involve long and complicated sequences of fabrication steps, and place heavy constraints on the construction of the whole semiconductor device, especially the trench, while also creating problems of criticality of the etching steps and selectivity of the materials to be used, which all restrict their applicability.

The underlying technical problem of this invention is to provide a process for integrating a semiconductor device having an insulating structure in a SOI substrate, which process has structural and functional features appropriate to make the process sequence simple and overcome the drawbacks with which conventional processes are still beset.

BRIEF SUMMARY OF THE INVENTION

The disclosed embodiments of the invention include using the nitride layer from the initial step of fabricating the semiconductor device as a hardmask, and forming the dielectric trenches for insulating the well of the semiconductor device before the active areas of the components to be integrated in the well are defined, thereby reducing the number of steps and making the integration process steps simpler and more flexible to carry out.

Based on this principle, the technical problem is solved by an integration process as previously indicated, and more specifically, to an integration process in a SOI substrate of a semiconductor device comprising at least a dielectrically insulated well, which process includes: an oxidizing step directed to form an oxide layer; a depositing step of a nitride layer onto said oxide layer; and a masking step, carried out onto said nitride layer using a resist layer and directed to define suitable photolithographic openings for forming at least one dielectric trench providing side insulation for the well.

In accordance with another embodiment of the invention, an integration process in an SOI substrate of a semiconductor device including at least a dielectrically insulated well is provided. The process includes and oxidizing step directed to form an oxide layer; a depositing step of a nitride layer onto the oxide layer; a masking step carried out on the nitride layer using a resist layer and defining a photolithographic opening for forming at least one dielectric trench effective to provide side insulation for the well; an etching step of the nitride layer and the oxide layer using the resist layer and the nitride layer as a hardmask; forming at least one dielectric trench and comprising at least one etching step of the substrate, an oxidizing step of at least sidewalls of the at least one dielectric trench, and a filling step of the at least one trench with a filling material; and a step of defining active areas of components to be integrated in the well, carried out after the step of forming the at least one dielectric trench.

BRIEF DESCRIPTION OF THE DRAWINGS

The features and advantages of the integration process according to this invention will be apparent from the following description of embodiments thereof, given by way of non-limitative examples with reference to the accompanying drawings.

DETAILED DESCRIPTION OF THE INVENTION

Figure 1:
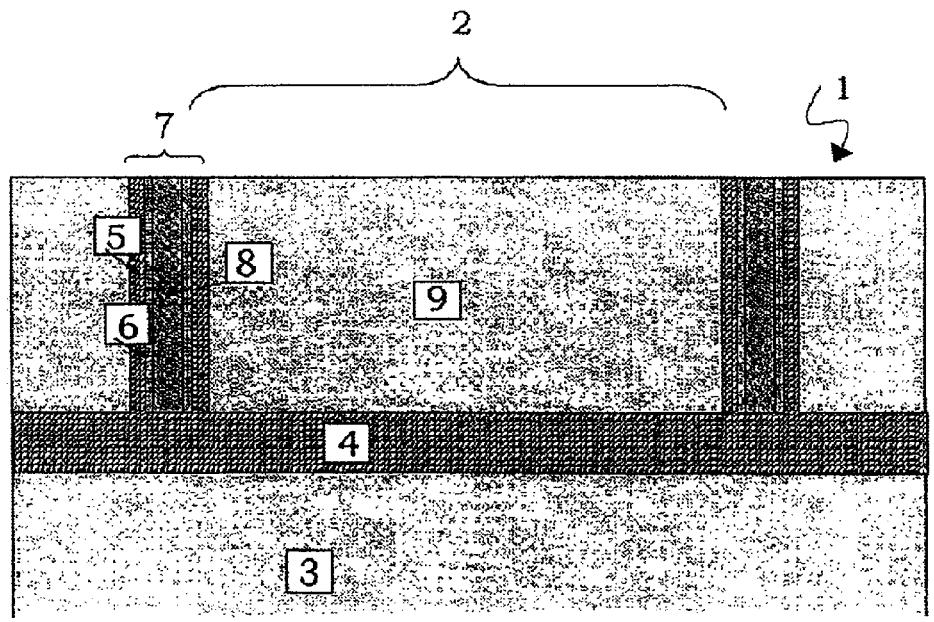
FIG. 1 shows schematically a semiconductor device having an insulating structure and being integrated in a SOI substrate, according to the prior art.
Figure 2A:
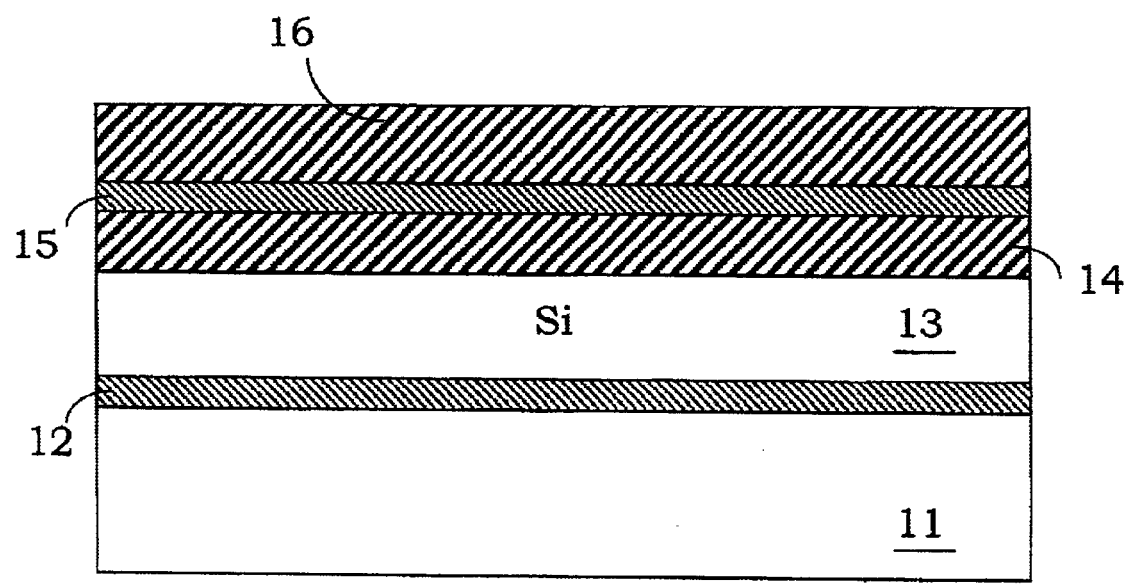
FIGS. 2A to 2O show schematically the device of FIG. 1 at different stages of its fabrication process, according to the prior art.
Figure 2B:
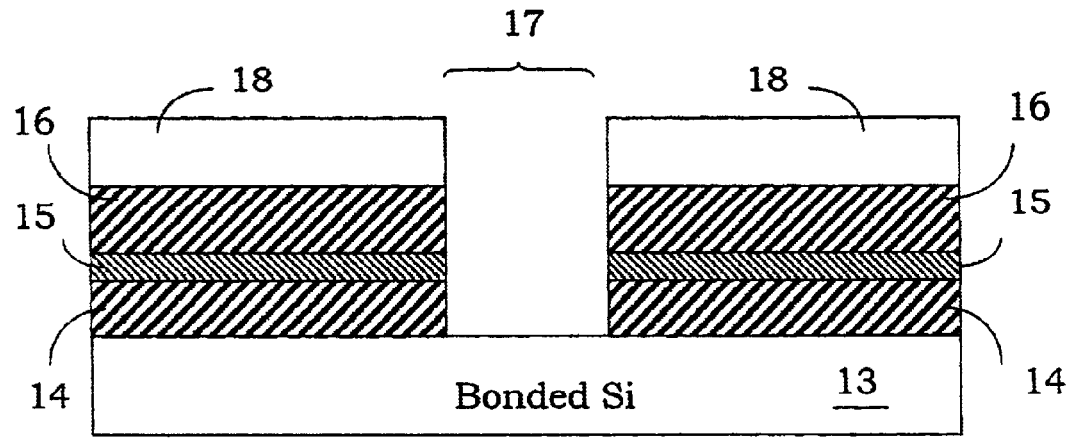
Figure 2C:
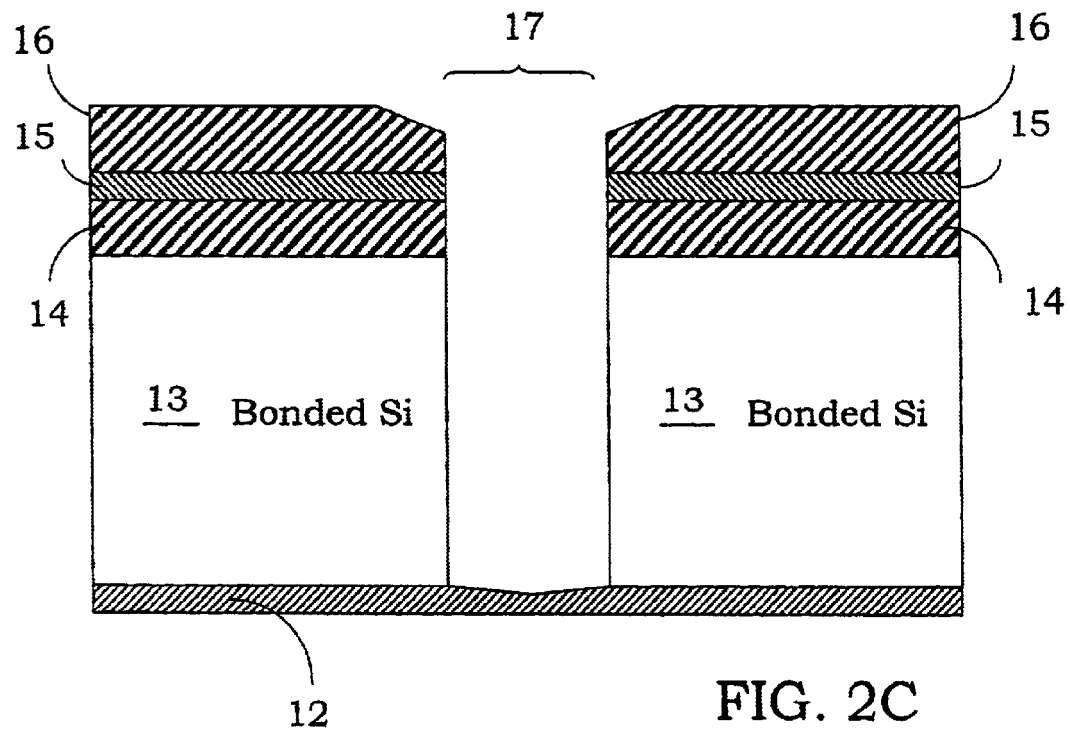
Figure 2D:
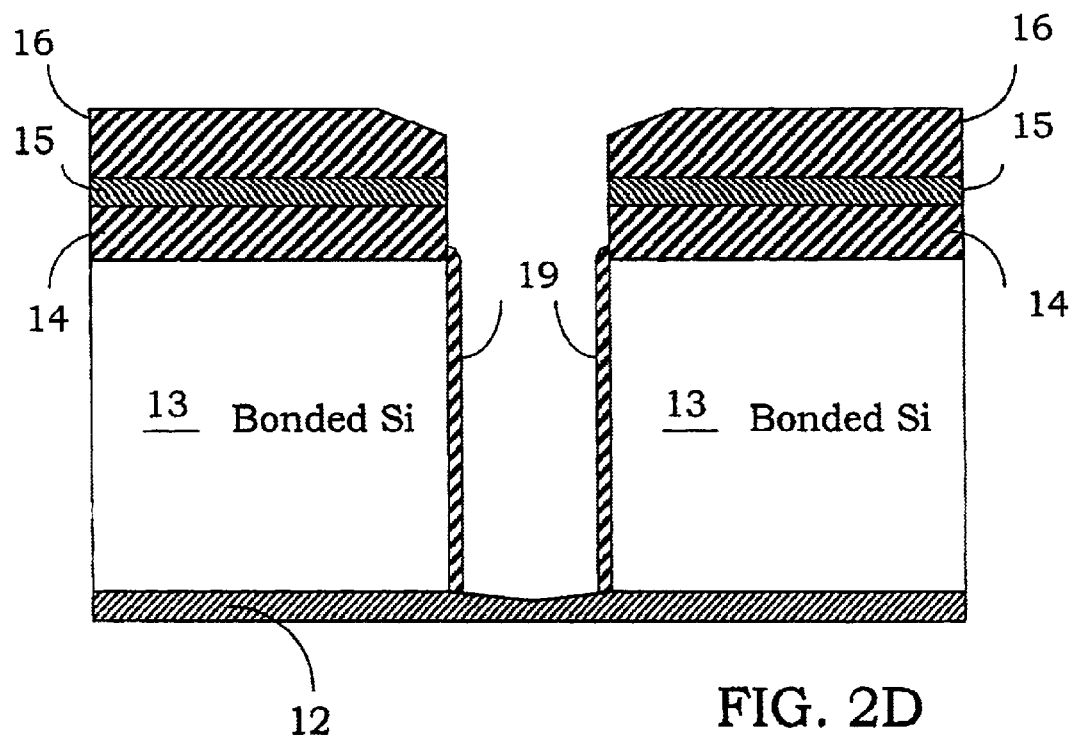
Figure 2E:
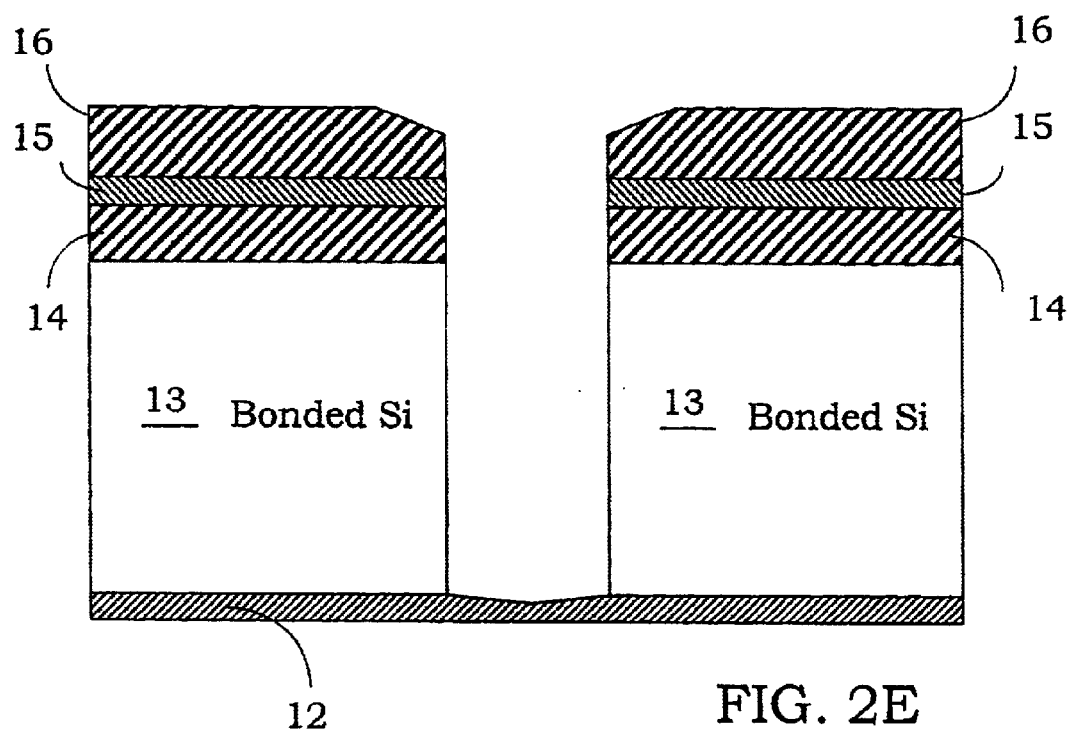
Figure 2F:
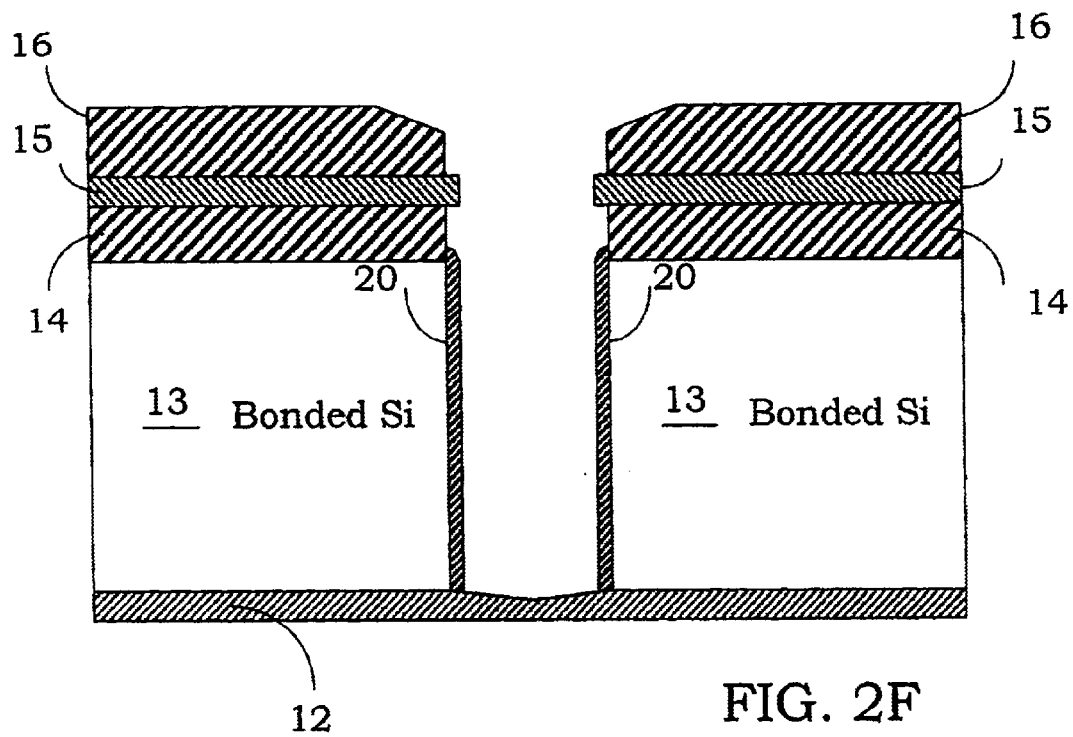
Figure 2G:
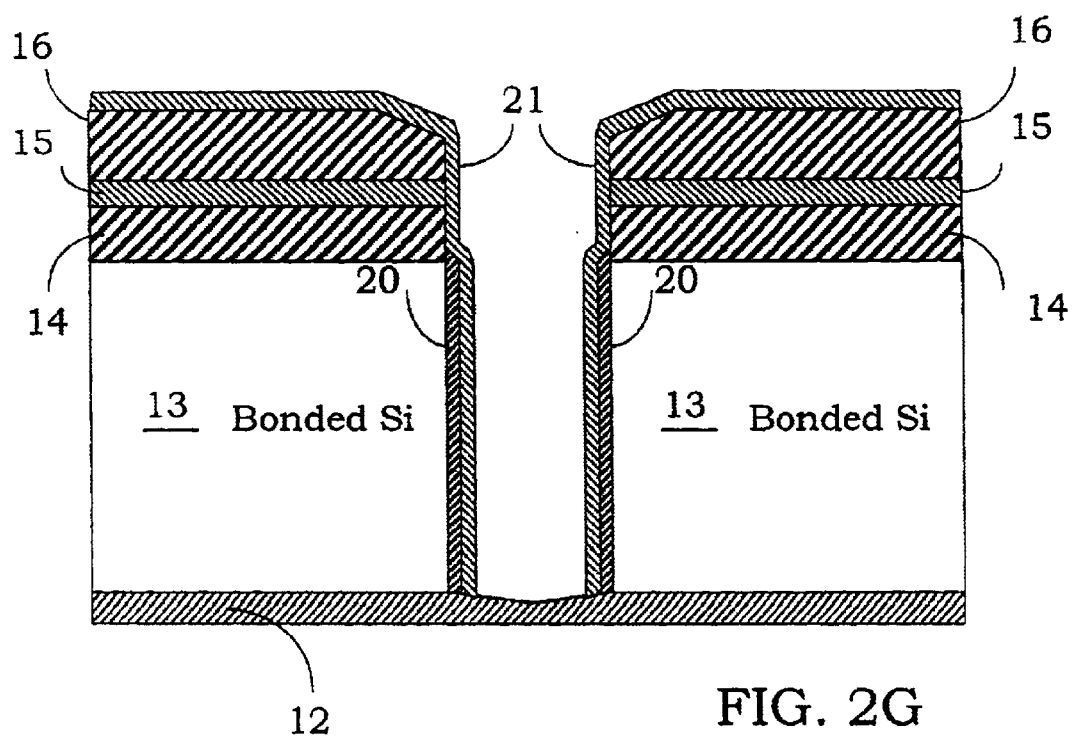
Figure 2H:
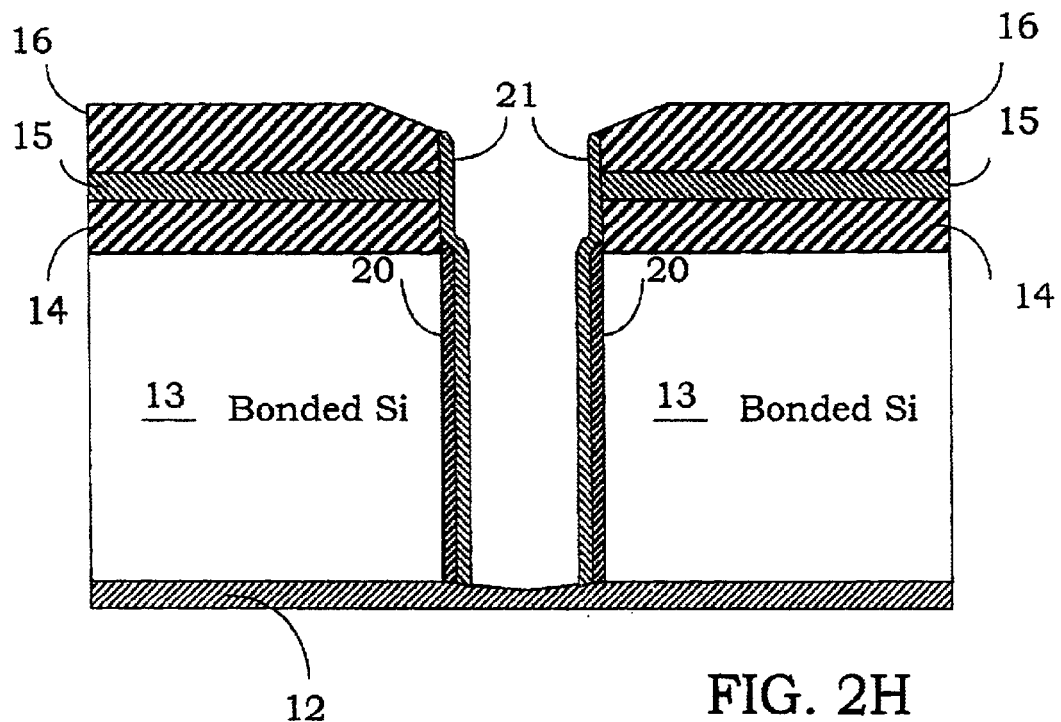
Figure 2I:
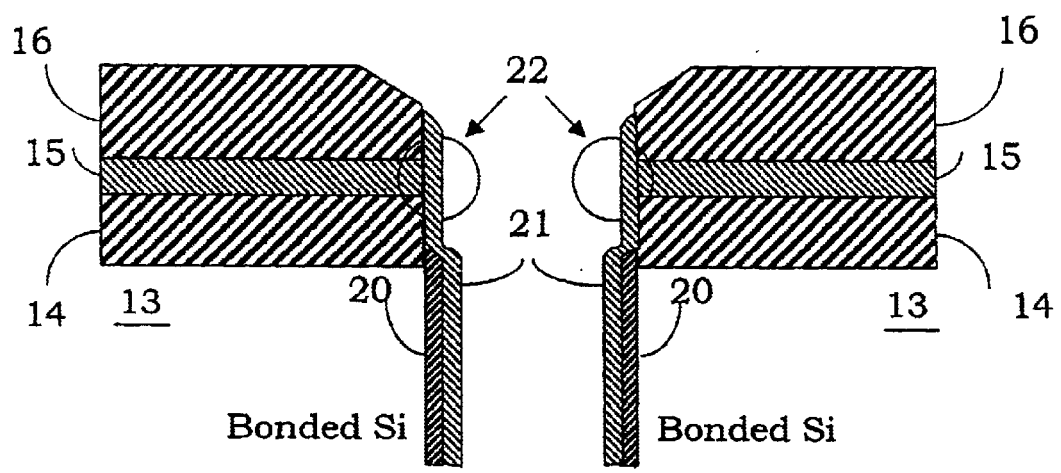
Figure 2J:
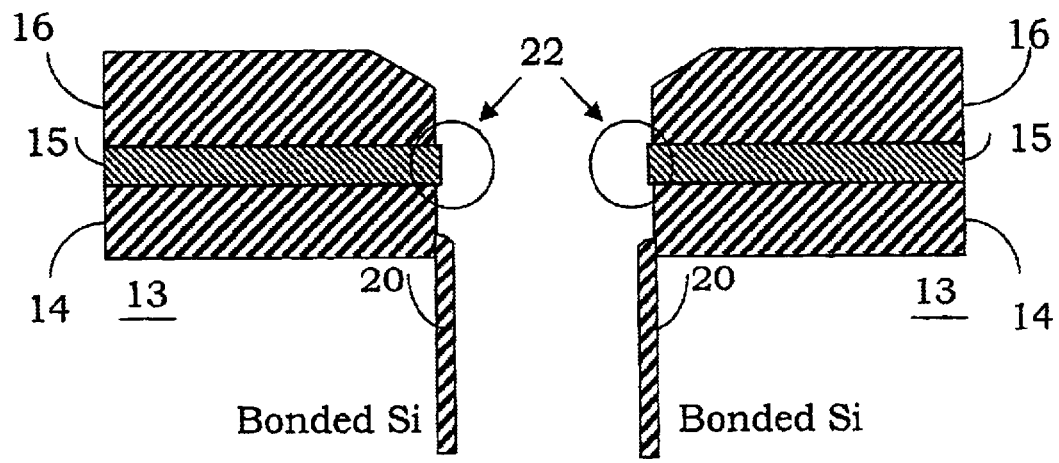
Figure 2K:
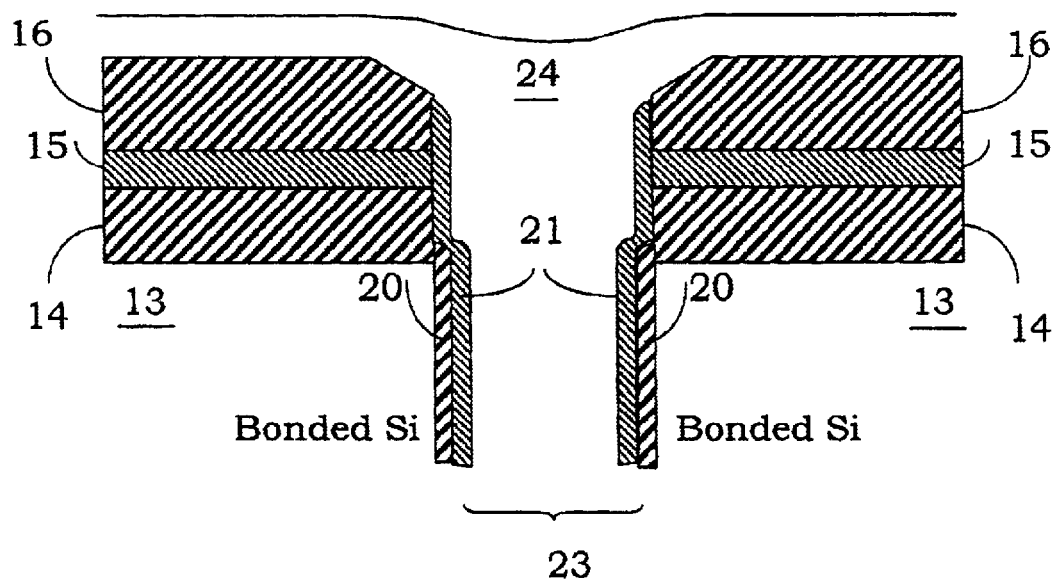
Figure 2L:
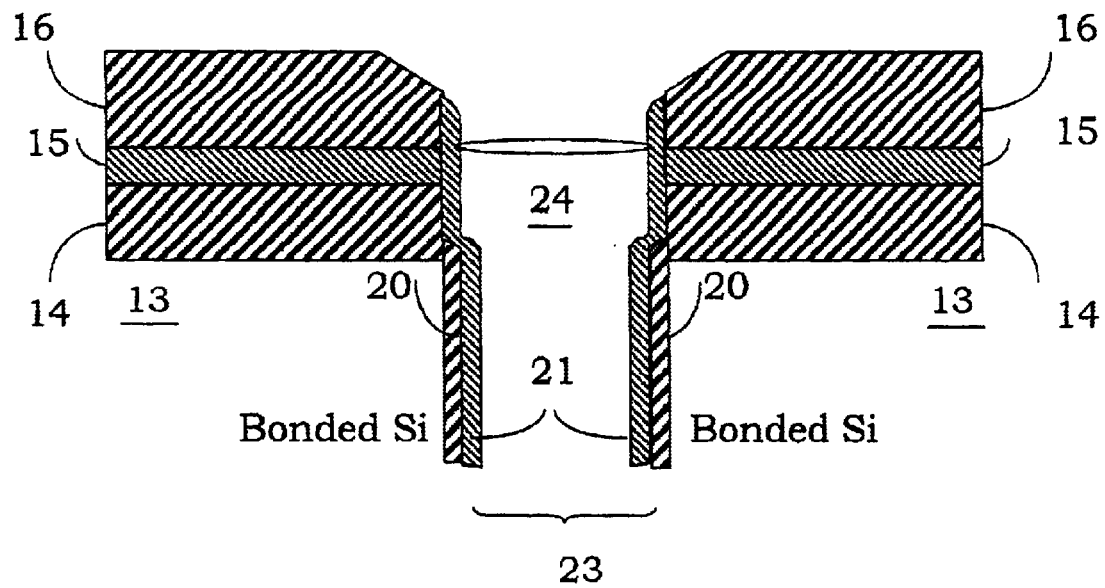
Figure 2M:
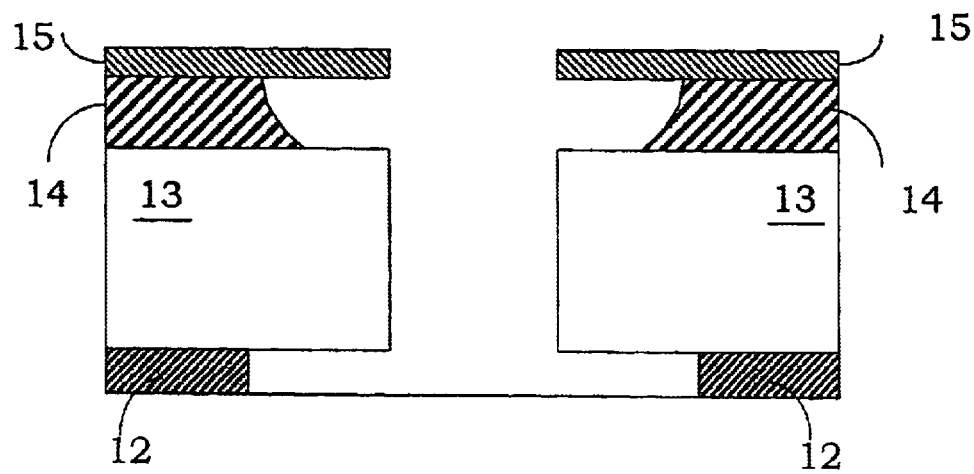
Figure 2N:
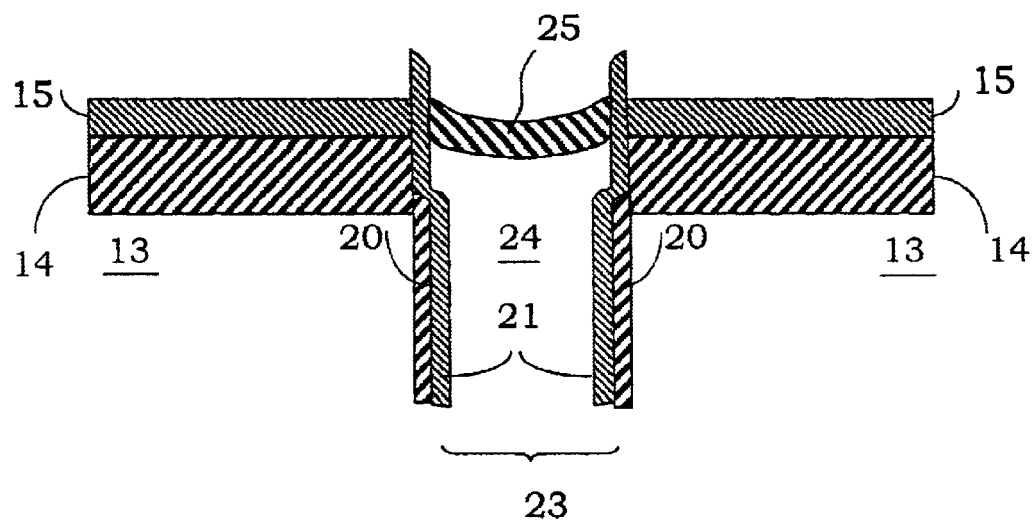
Figure 2O:
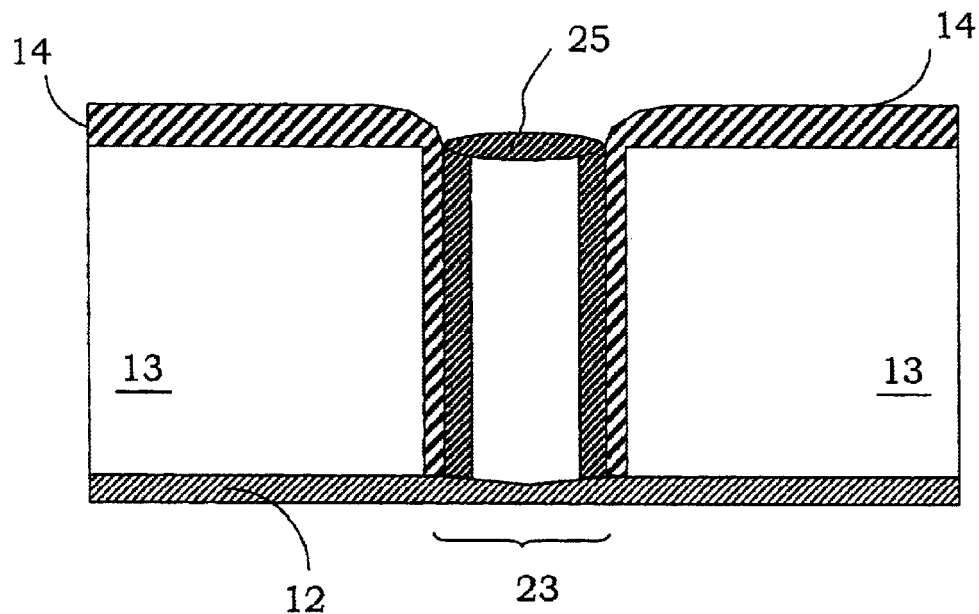
Figure 3A:
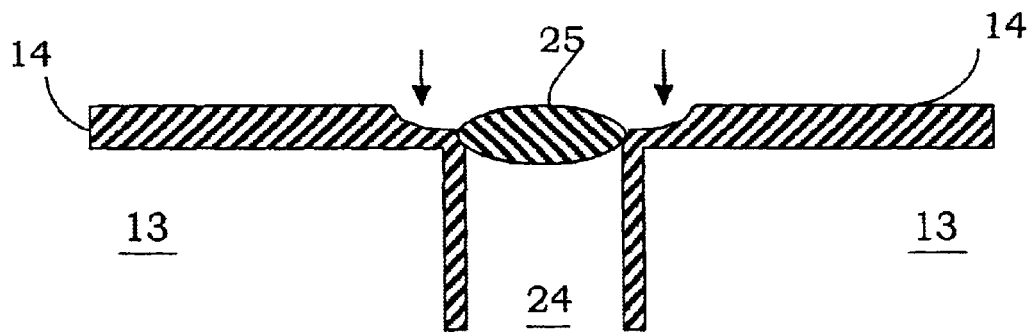
FIGS. 3A to 3C show schematically the device of FIG. 1 at different stages of an alternative embodiment of its fabrication process, according to the prior art.
Figure 3B:
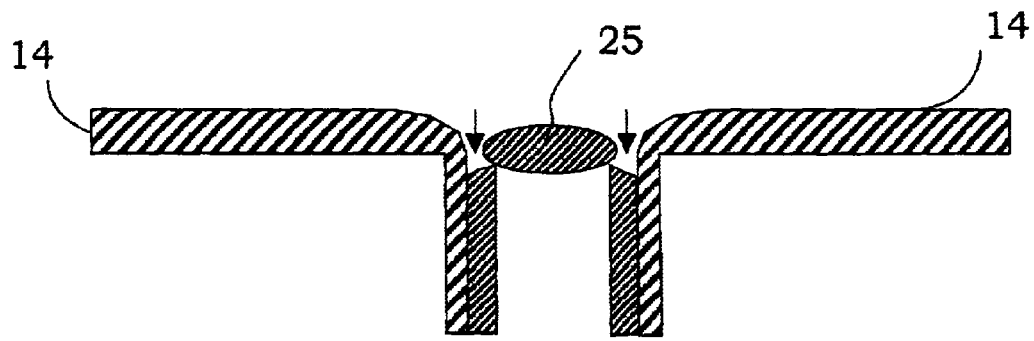
Figure 3C:
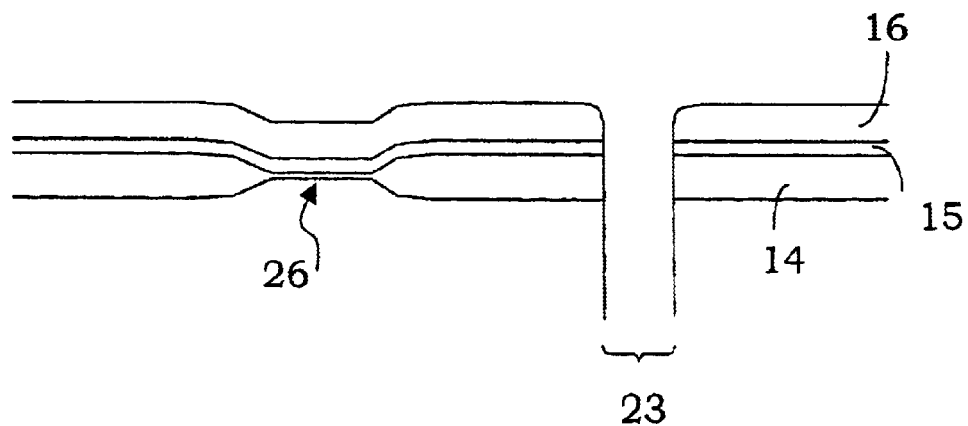
Figure 4A:
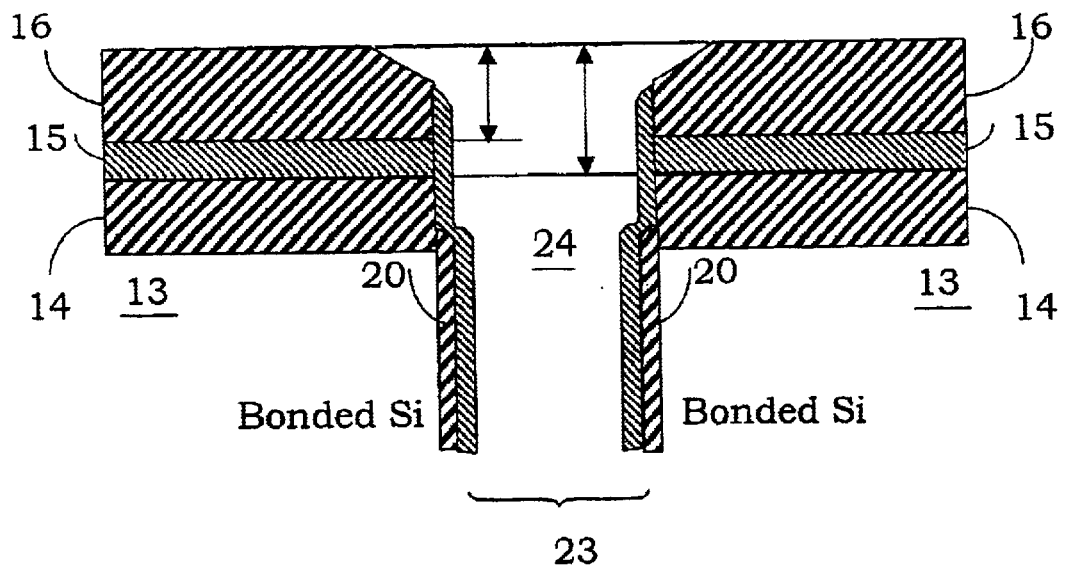
FIGS. 4A and 4B show schematically the device of FIG. 1 at different stages of another alternative embodiment of its fabrication process, according to the prior art.
Figure 4B:
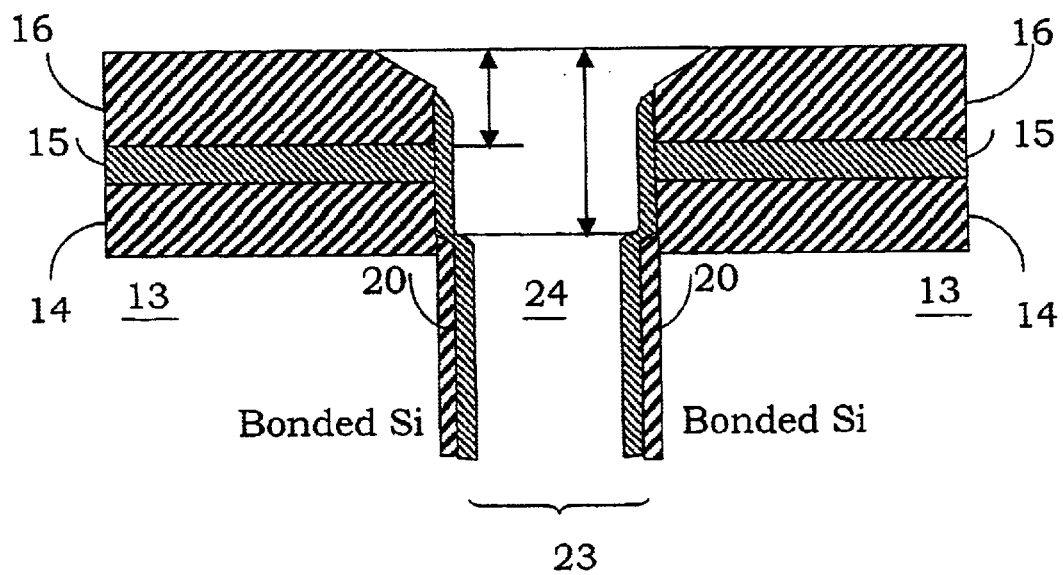
Figure 5A:
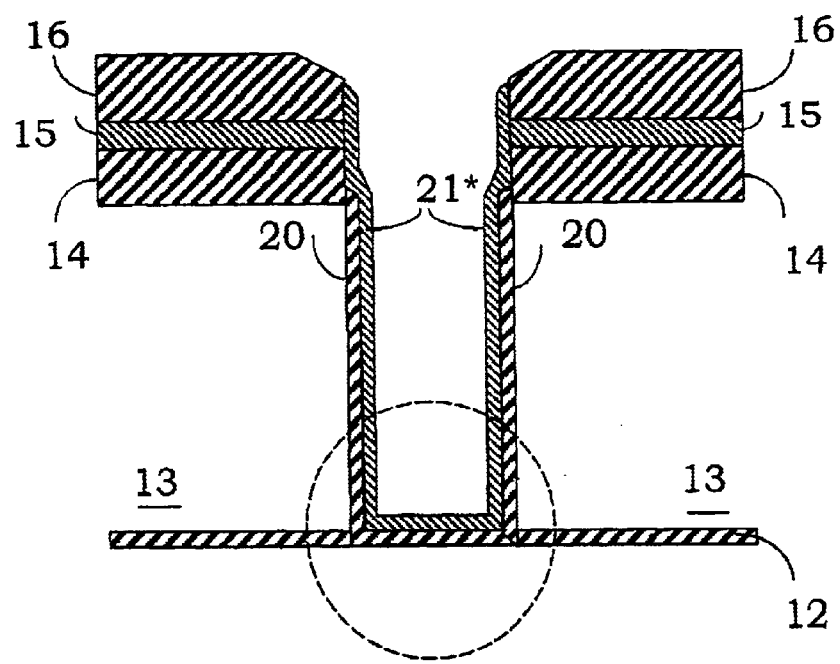
FIGS. 5A to 5F show schematically the device of FIG. 1 at different stages of a further alternative embodiment of its fabrication process, according to the prior art.
Figures 1, 5A:
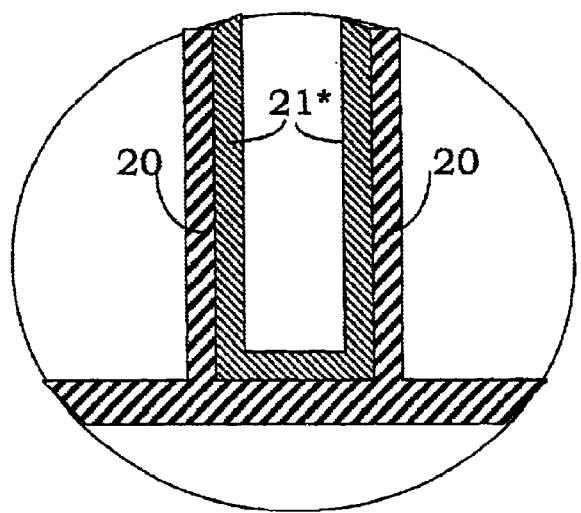
Figure 5B:
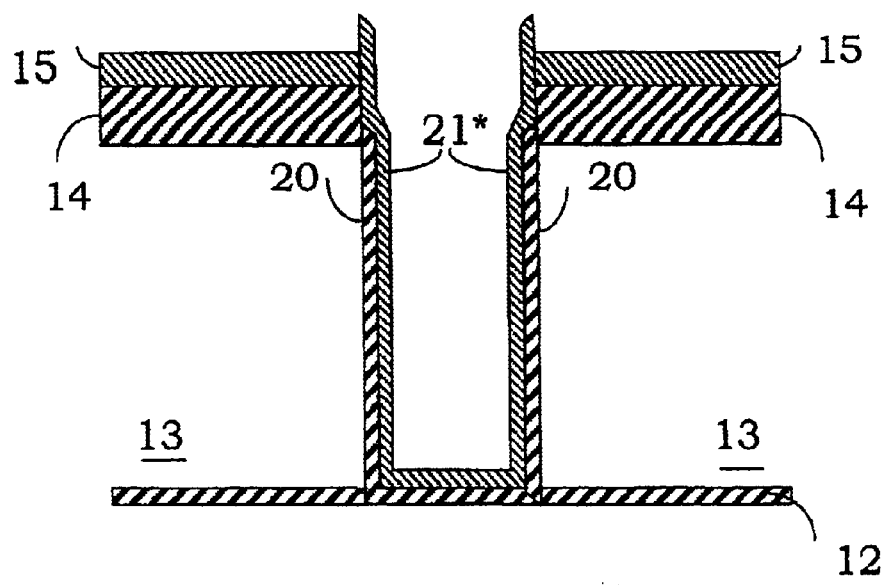
Figure 5C:
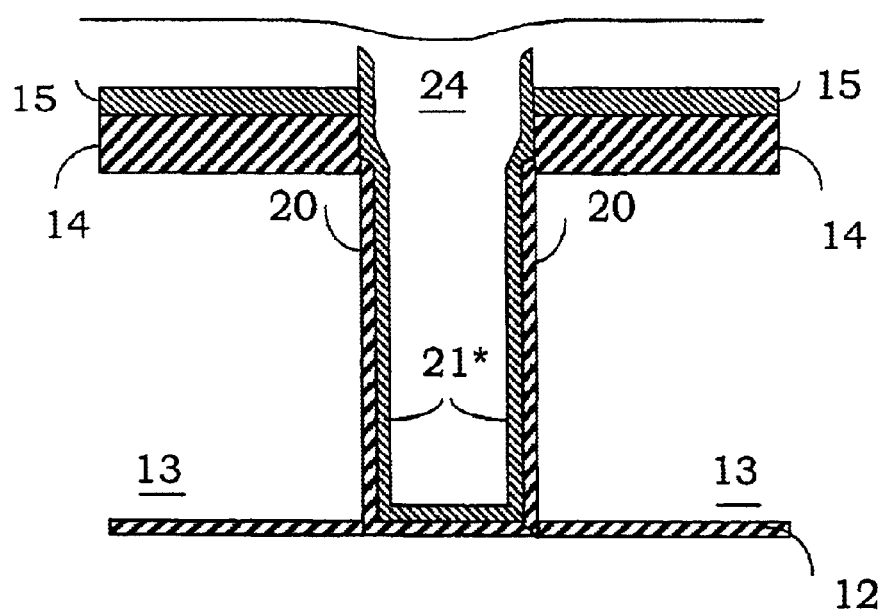
Figure 5D:
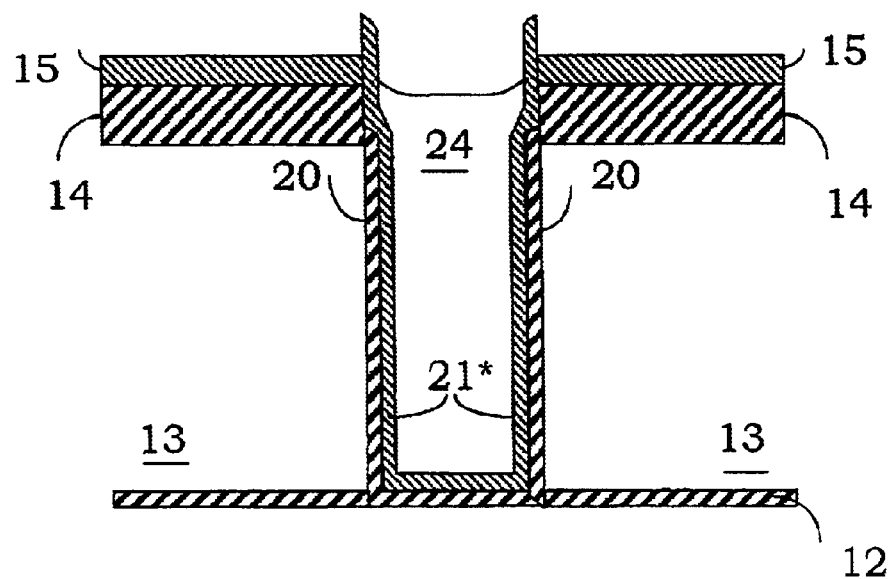
Figure 5E:
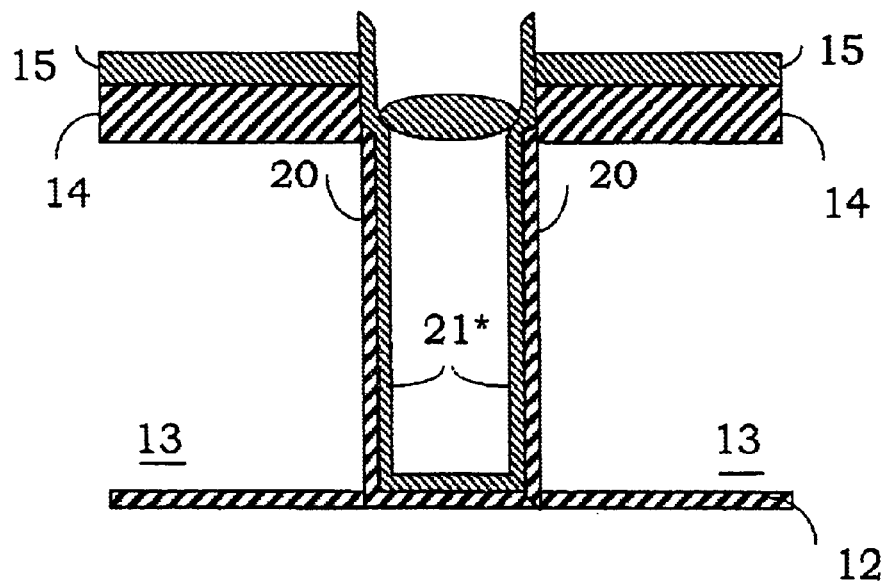
Figure 5F:
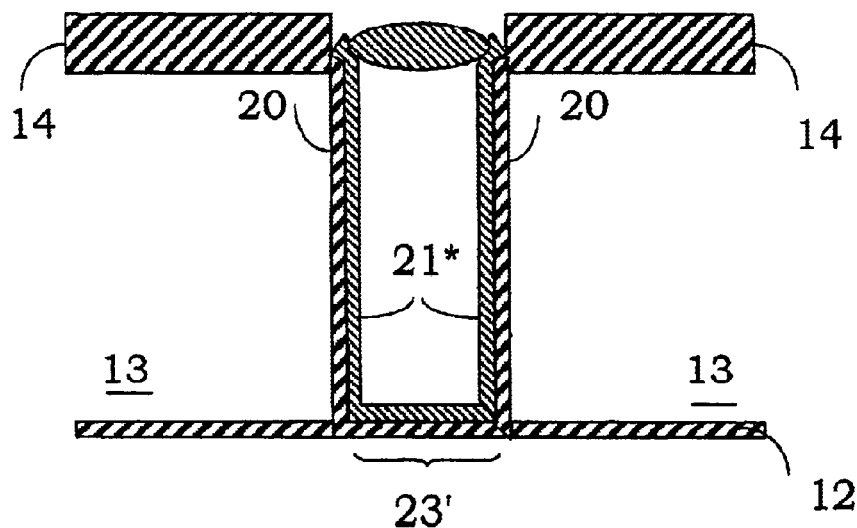
Figure 6A:
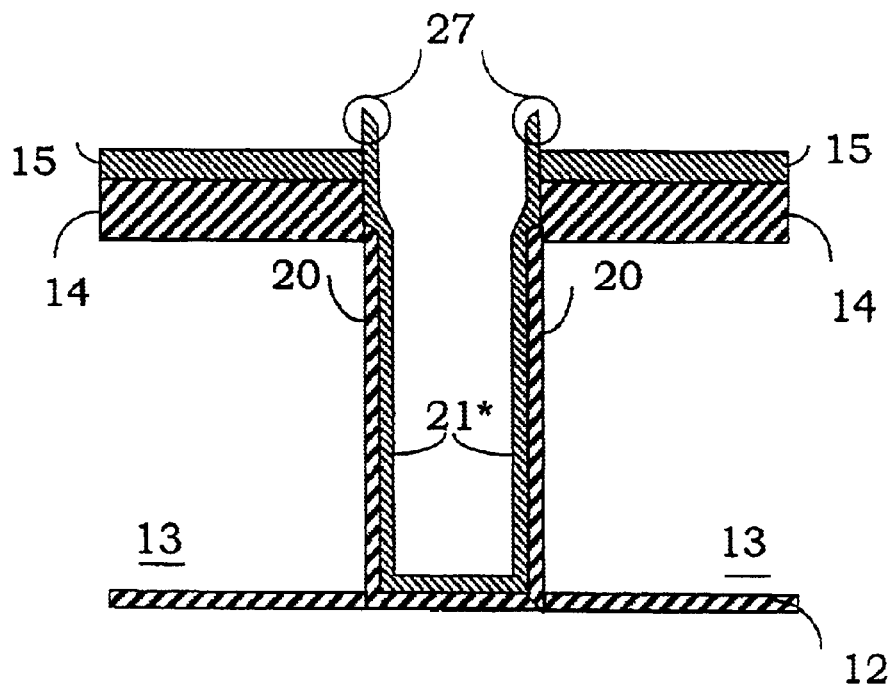
FIGS. 6A to 6E show schematically the device of FIG. 1 at different stages of still another alternative embodiment of its fabrication process, according to the prior art.
Figure 6B:
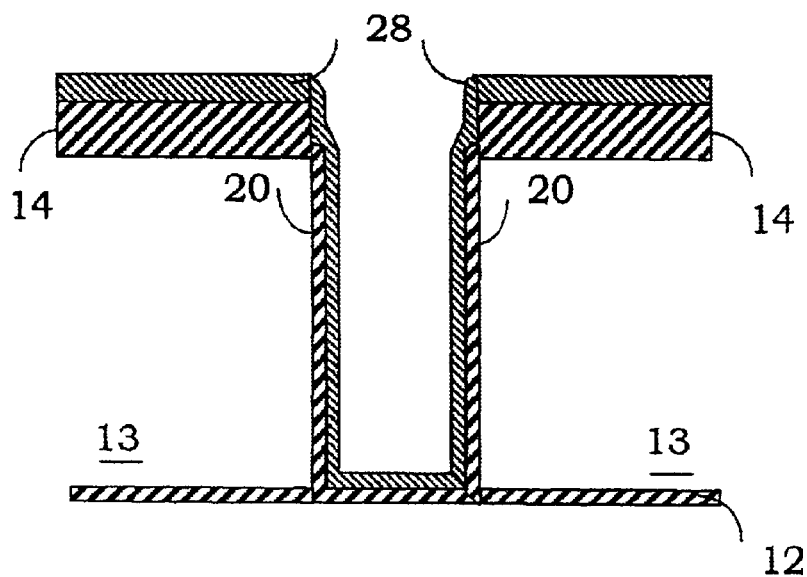
Figure 6C:
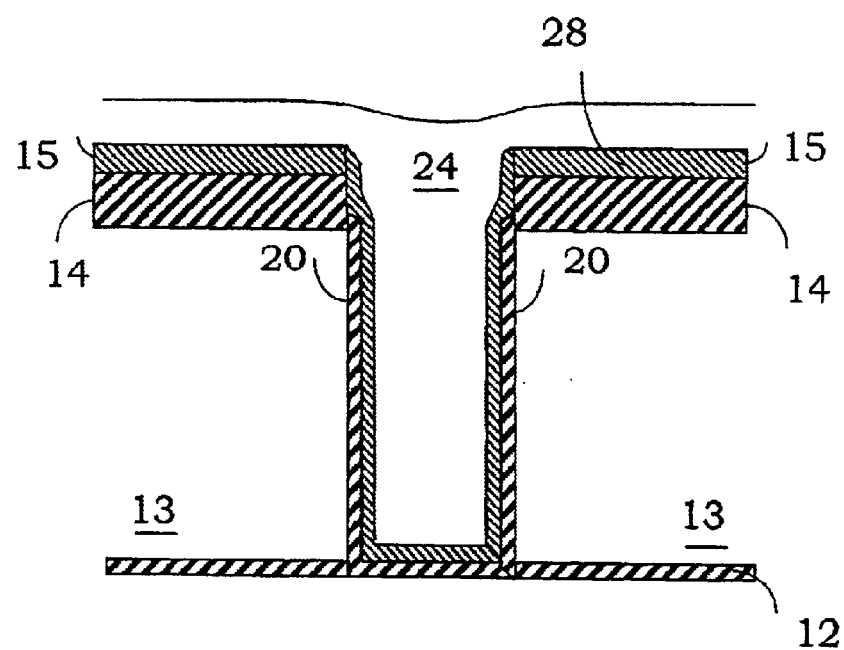
Figure 6D:
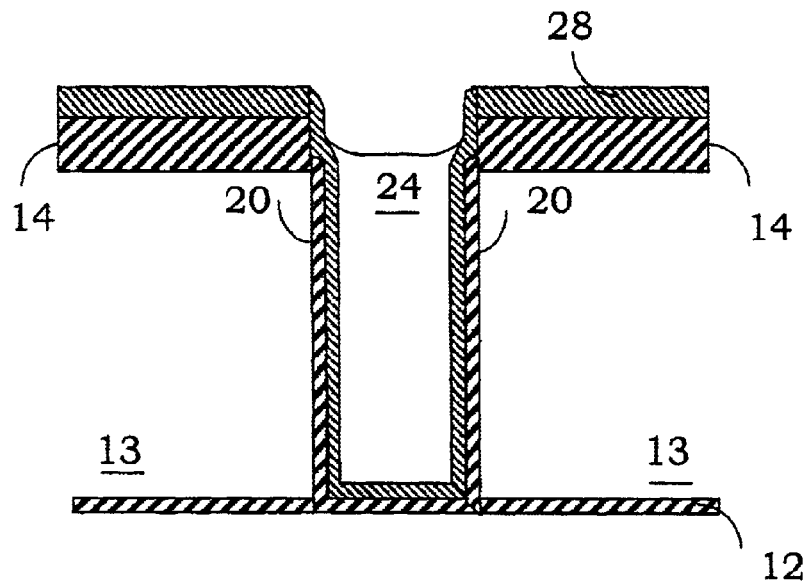
Figure 6E:
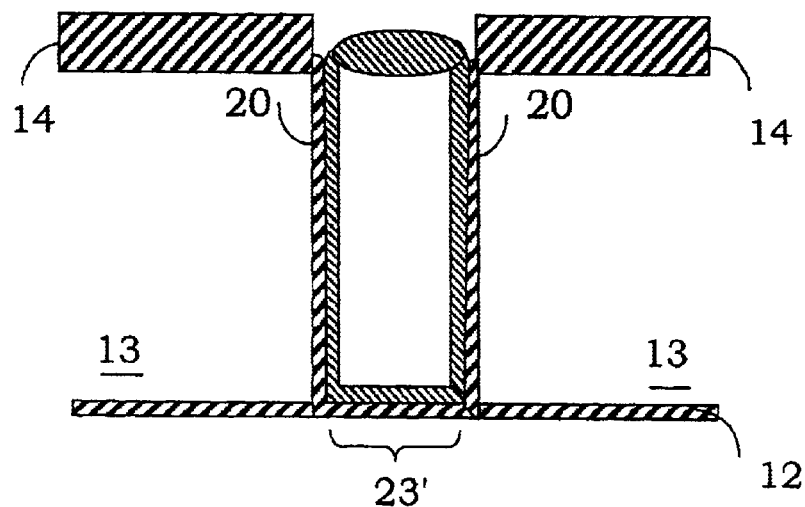
Figure 7A:
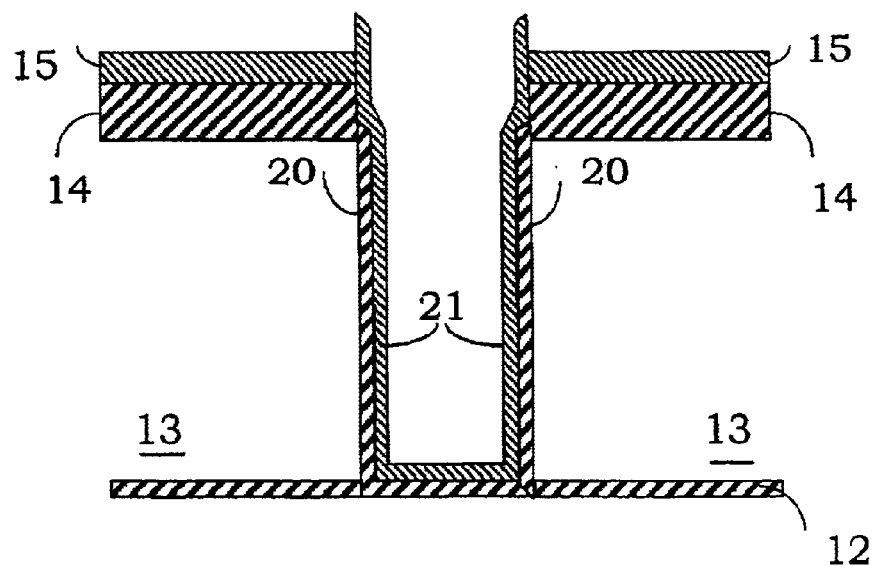
FIGS. 7A to 7E show schematically the device of FIG. 1 at different stages of another alternative embodiment of its fabrication process, according to the prior art.
Figure 7B:
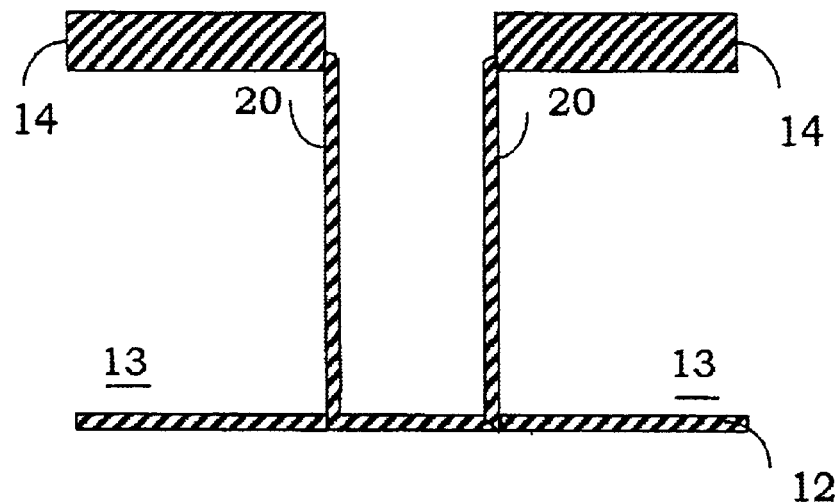
Figure 7C:
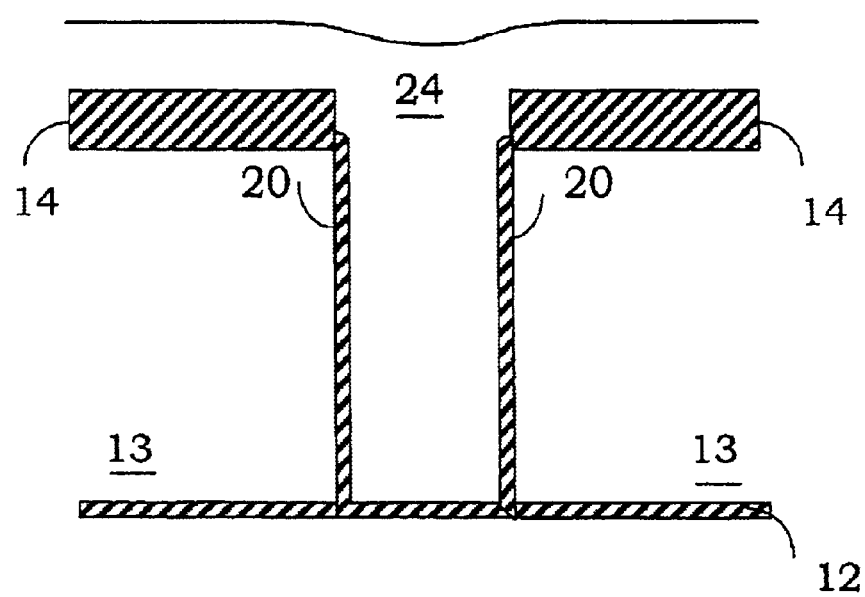
Figure 7D:
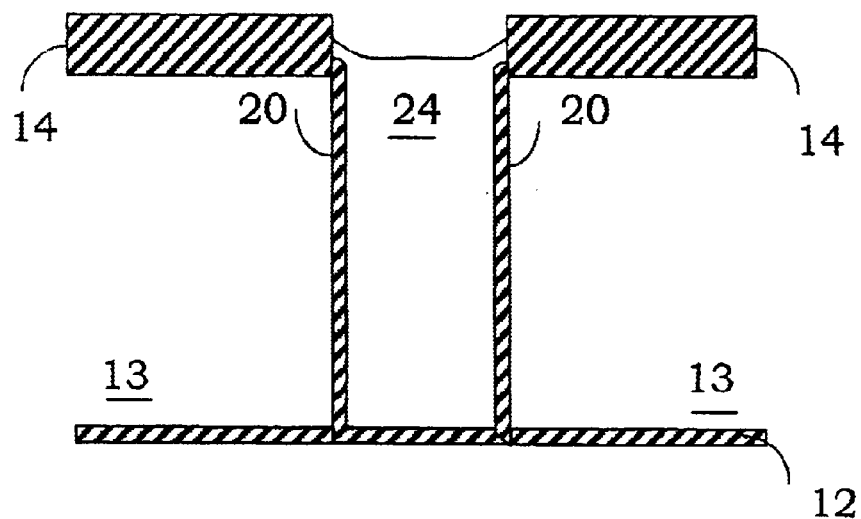
Figure 7E:
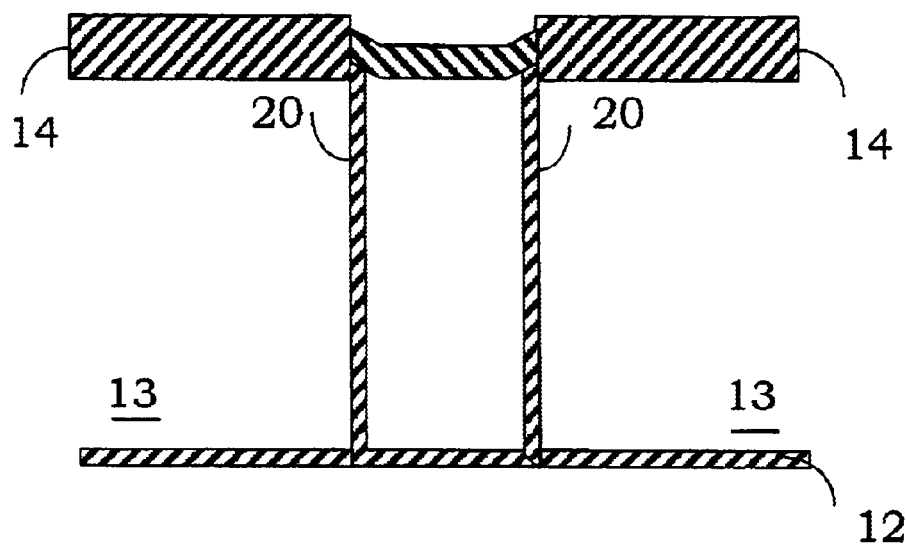
Figure 8A:
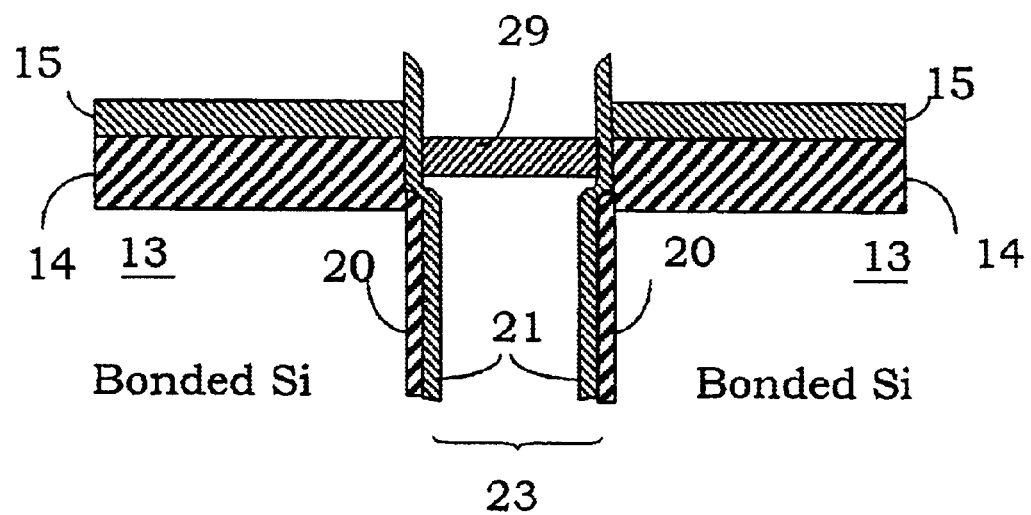
FIGS. 8A to 8C show schematically a detail of the device of FIG. 1 at different stages of another alternative embodiment of its fabrication process, according to the prior art.
Figure 8B:
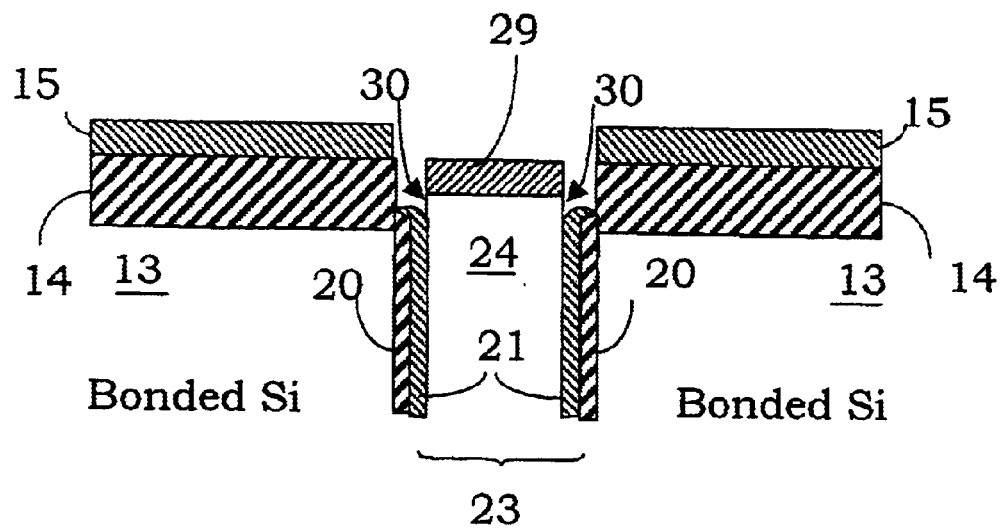
Figure 8C:
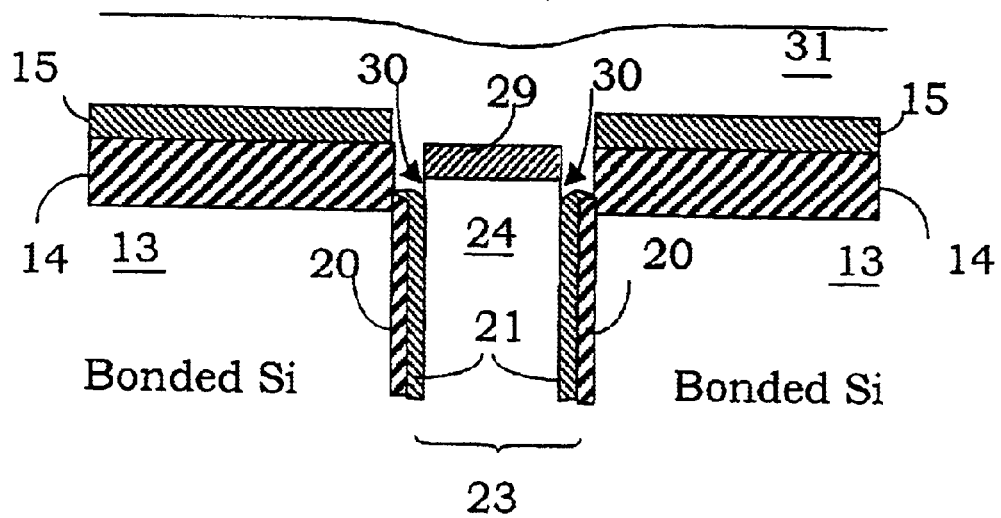
Figure 9:
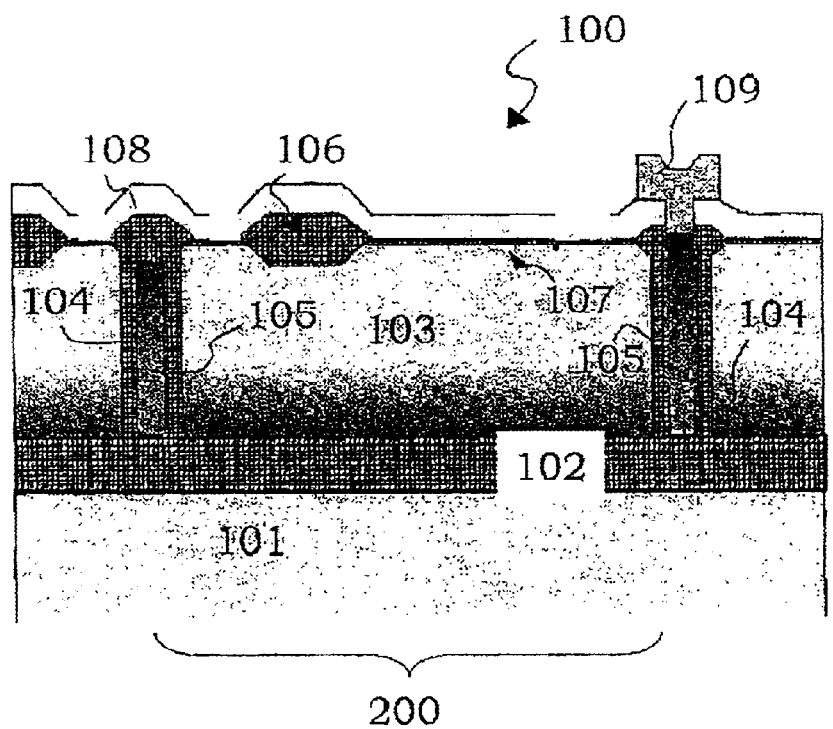
FIG. 9 shows schematically a semiconductor device having an insulating structure and being integrated in a SOI substrate, according to the invention.

With reference to the drawings, in particular to FIG. 9 thereof, a semiconductor device, fabricated according to the invention in a SOI substrate, is generally and schematically shown at 100.

The semiconductor device 100 includes essentially a well 200 that is formed above a substrate 103 of the SOI type and is insulated dielectrically by a trench of insulating structure 104.

As previously described with reference to the prior art solutions, the semiconductor device 100 includes a substrate region 101 that is also known as the handle-wafer and is usually to provide mechanical support.

Formed in the substrate region 101 is a layer 102 of buried oxide (BOX) acting as vertical insulation for the well 200, the latter being overlaid by the SOI substrate 103. The well 200 also includes, formed in the SOI substrate 103, a high-concentration buried layer 110, specifically of the n type.

To insulate the well 200 laterally, the semiconductor device 100 further includes at least one dielectric trench 104, contacting the buried oxide layer 102 and being filled with a polysilicon filling material 105.

The semiconductor device 100 includes, formed on top of the SOI substrate 103, a thick oxide layer 106, a thin oxide layer 107, and a layer 108 isolating the surface dielectrics of the components (VAPOX or TEOS).

A metallization 109 completes the semiconductor device 100.

The process for integrating the semiconductor device 100, according to this invention, will now be described through the steps shown in FIGS. 10A to 10S.

Figure 10A:
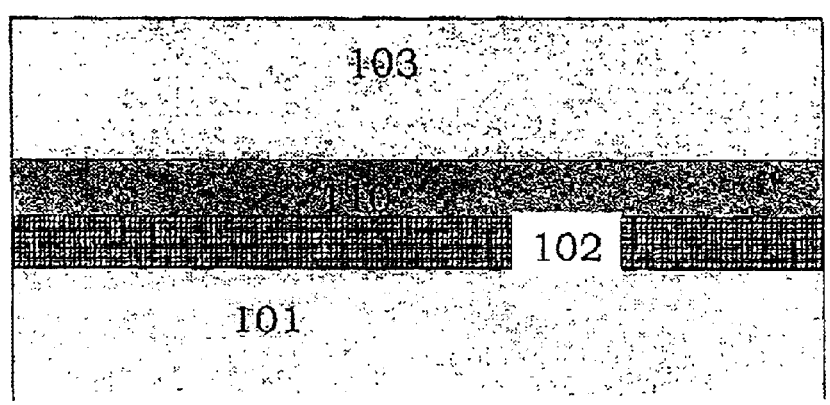
FIGS. 10A to 10S show schematically the device of FIG. 9 at different stages of its fabrication process, according to the invention.
Figure 10B:
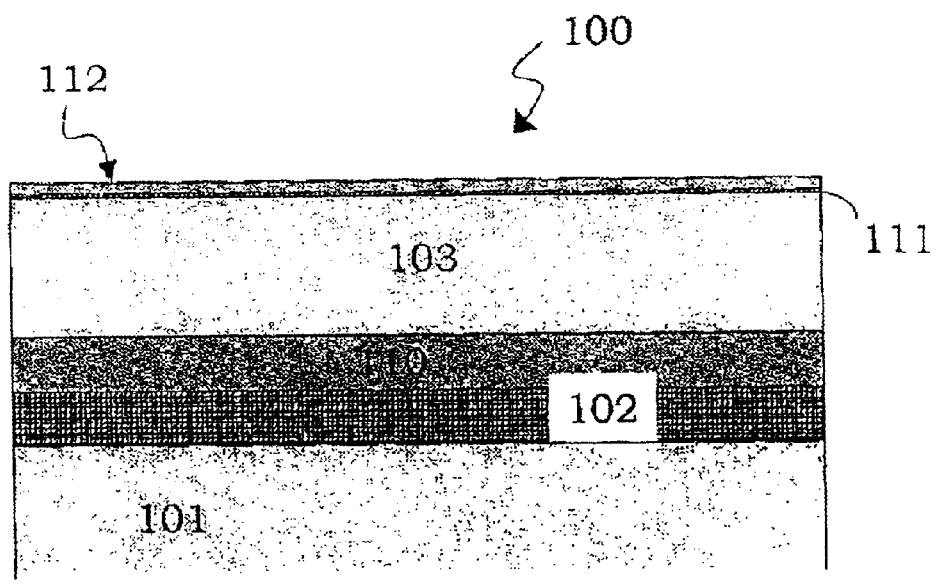

A so-called pad oxidizing step is carried out on a SOI substrate blank that comprises a substrate region 101, a buried oxide layer 102, and a SOI substrate 103 wherein the high-concentration buried layer 110 locates (as shown schematically in FIG. 10A), in order to form a pad oxide layer 111, and is followed by a depositing step of a nitride layer 112 (as shown schematically in FIG. 10B).

Advantageously in this invention, the nitride layer 112 is used as a hardmask, unlike the conventional sequence. Its thickness is then calibrated on the basis of the selectivity values of silicon with respect to nitride, so as to ensure its performance as a hardmask throughout the etching steps to be carried out later in order to produce the dielectric trench 104.

It should be noted that a great thickness of the nitride layer 112 might result in crystal stress causing flaws to appear in the silicon surface of the semiconductor device 100. This potential problem has been overcome conventionally by keeping the thickness ratio between the nitride layer 112 and the pad oxide layer below 3 or 4.

In a preferred embodiment of the semiconductor device 100 according to the invention, the thickness of the pad oxide layer 111 is selected equal to about 500 Å, and the thickness of the nitride layer 112 equal to about 1400 Å.

Figure 10C:
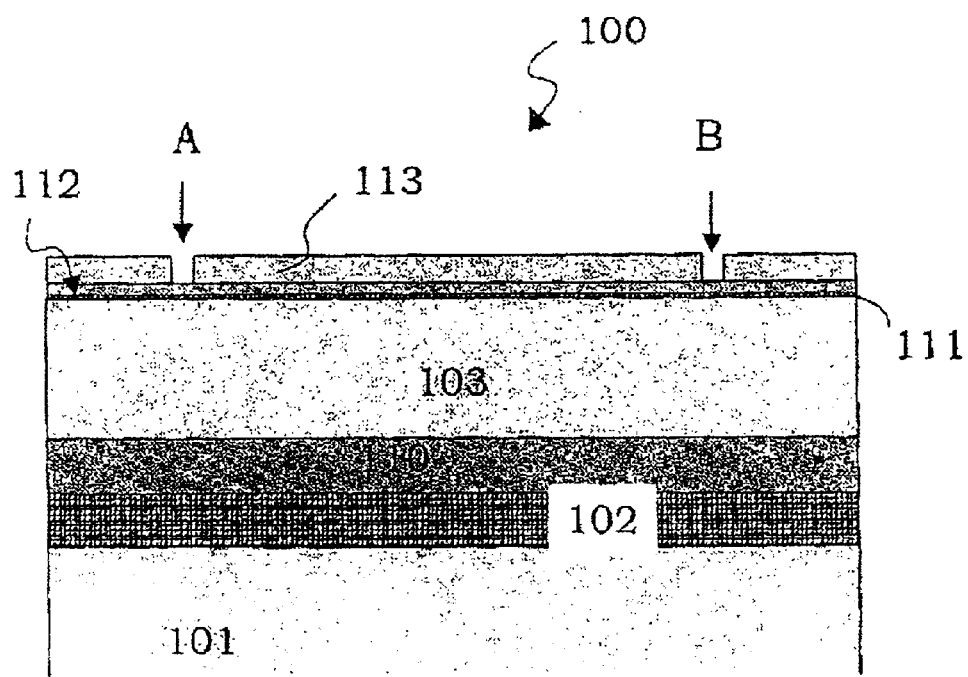

The integration process according to the invention further comprises a masking step, carried out conventionally by depositing, exposing and developing a resist layer 113 so as to define a photolithographic opening for use in forming the dielectric trenches 104 (as shown schematically in FIG. 10C).

Figure 10D:
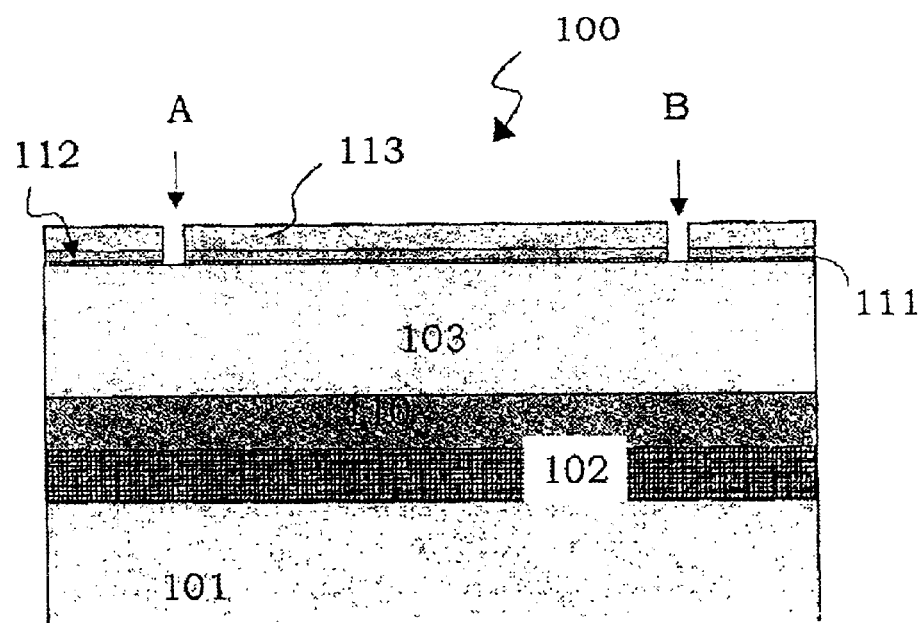
Figure 10E:
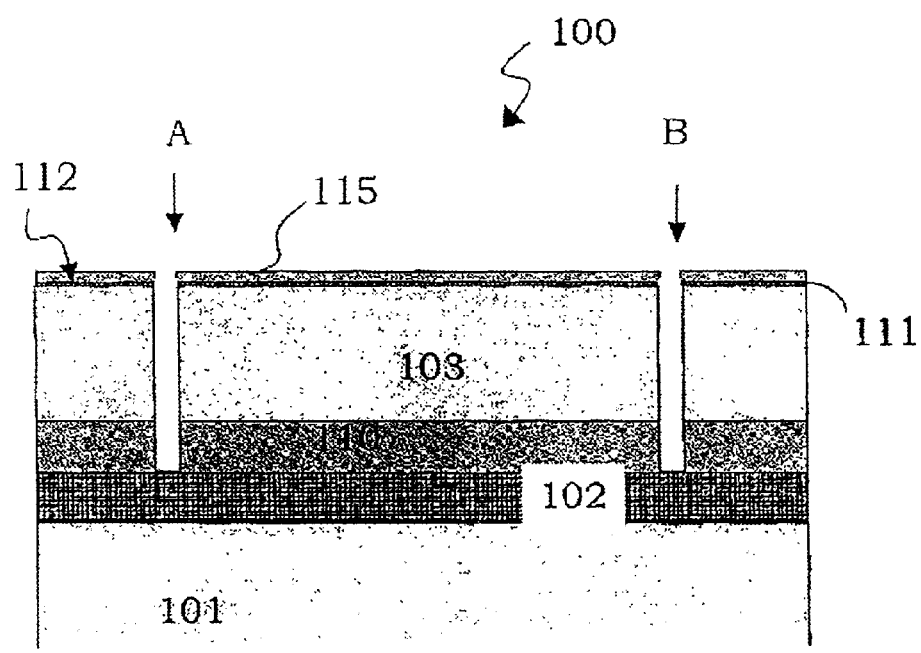
Figure 10F:
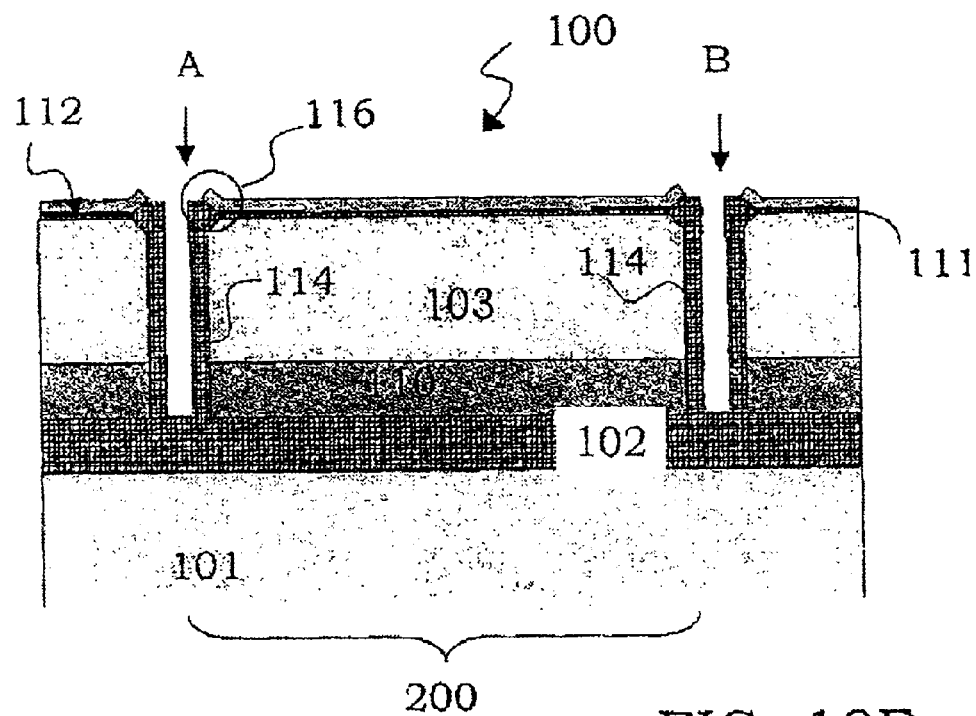
Figure 10G:
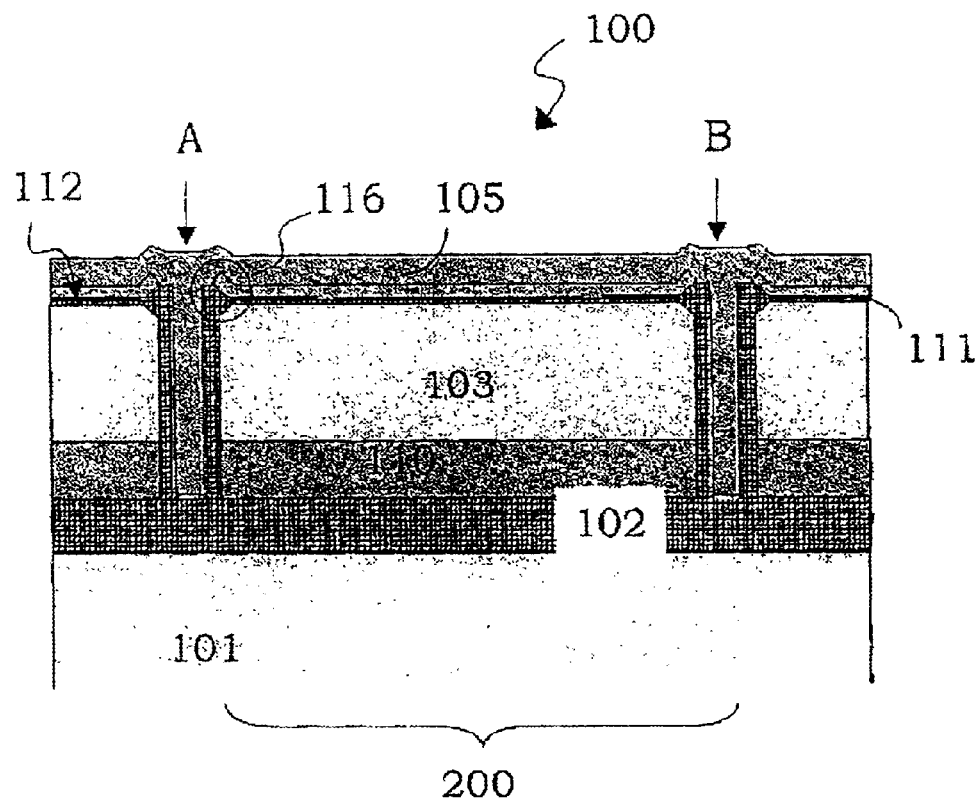
Figure 10H:
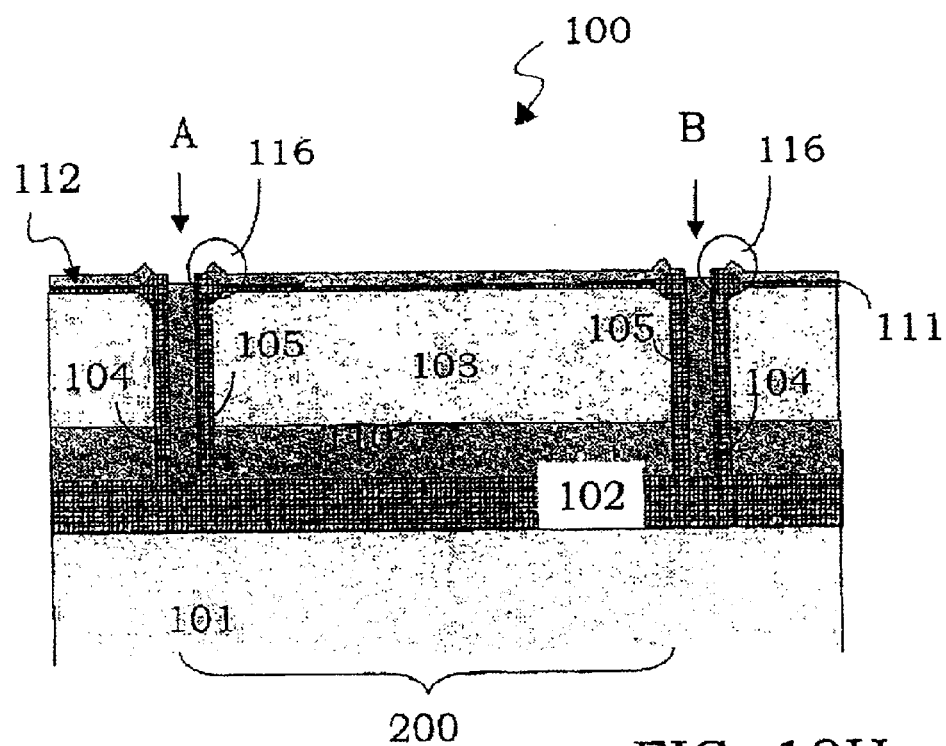
Figure 10I:
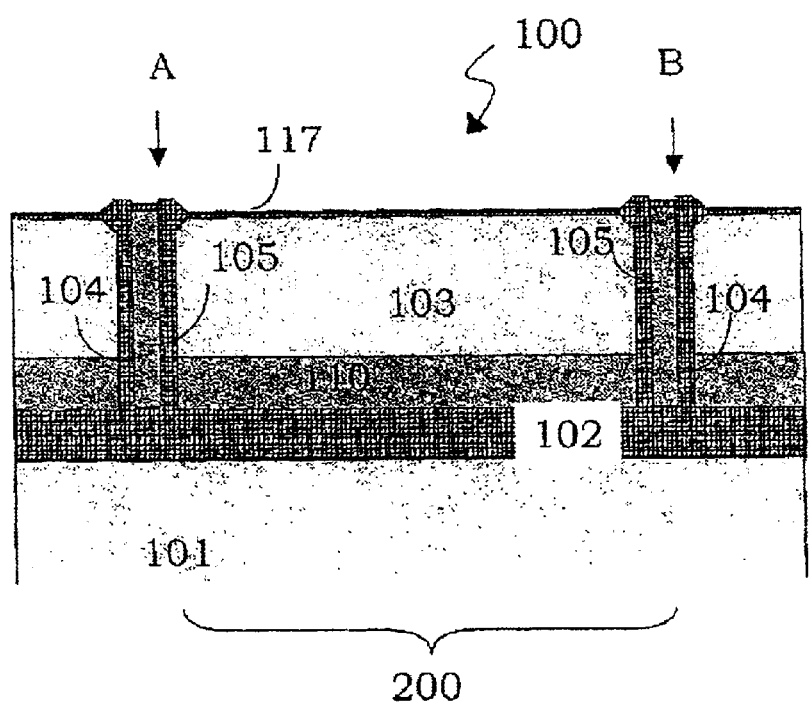
Figure 10L:
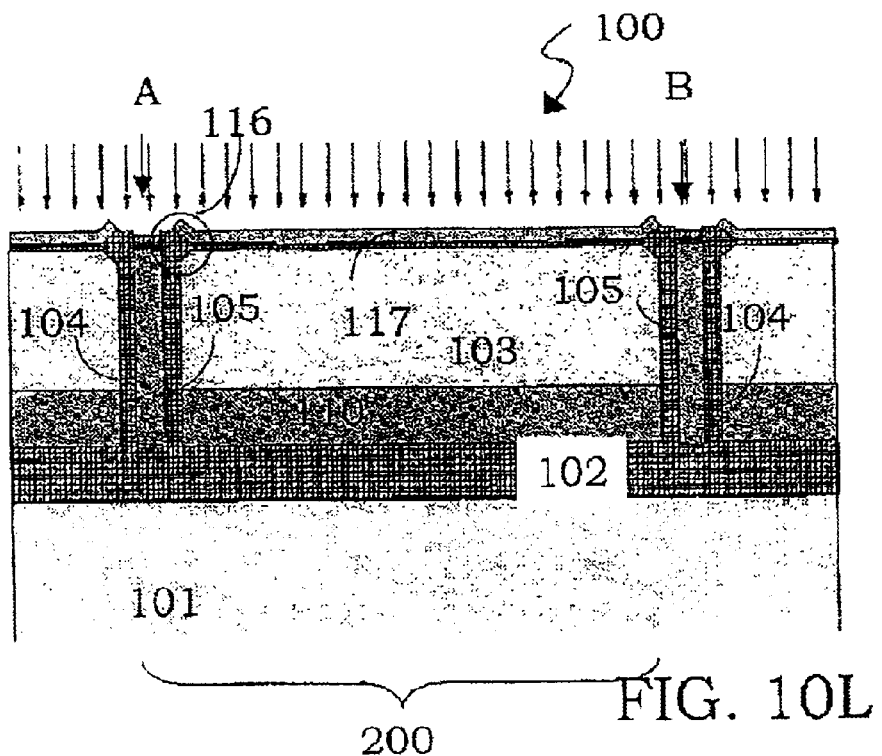
Figure 10M:
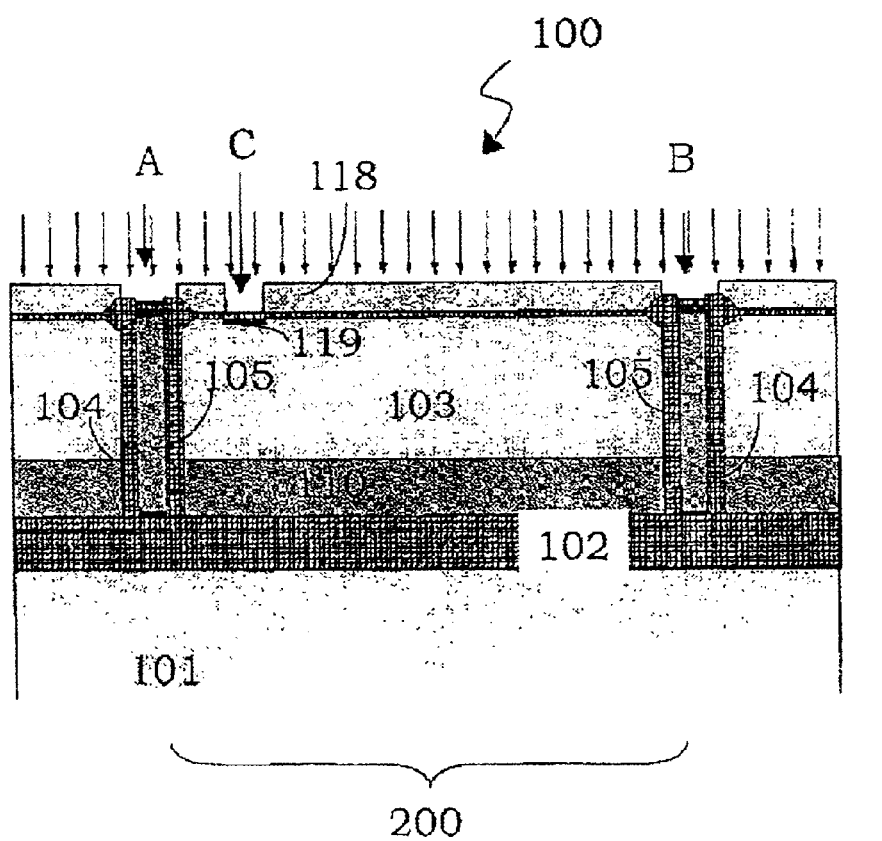
Figure 10N:
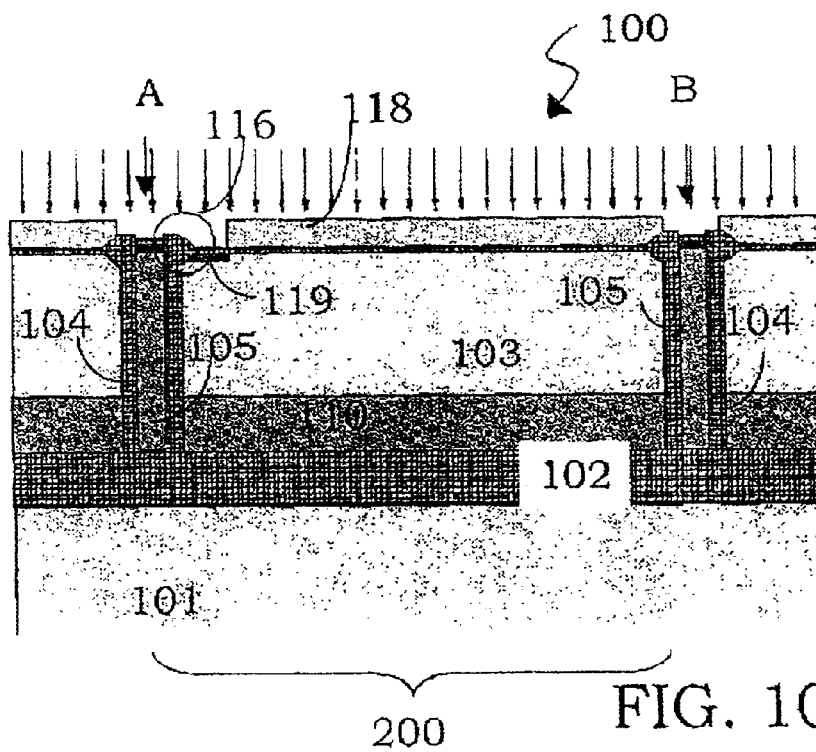
Figure 10O:
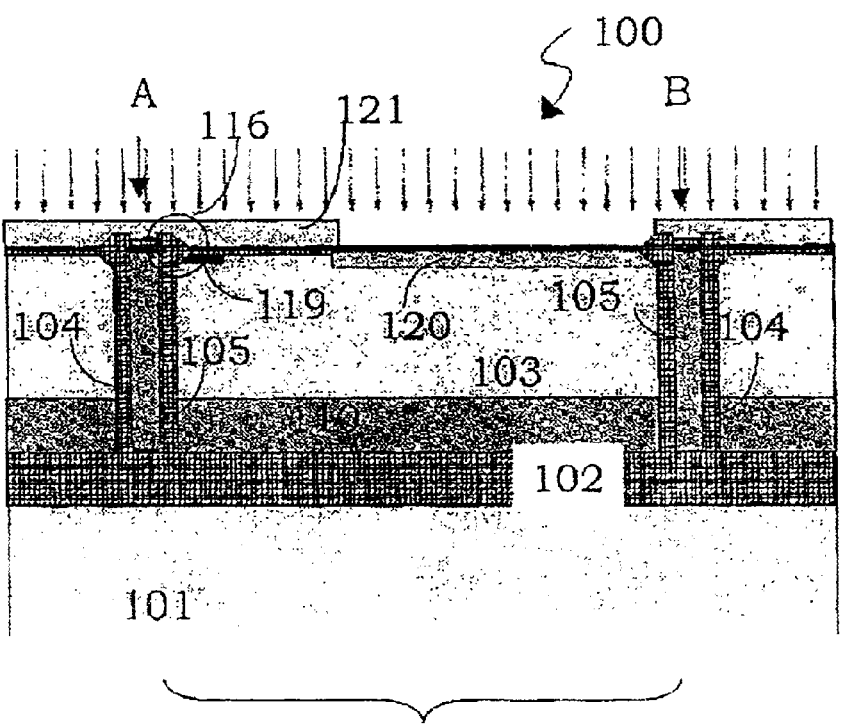
Figure 10P:
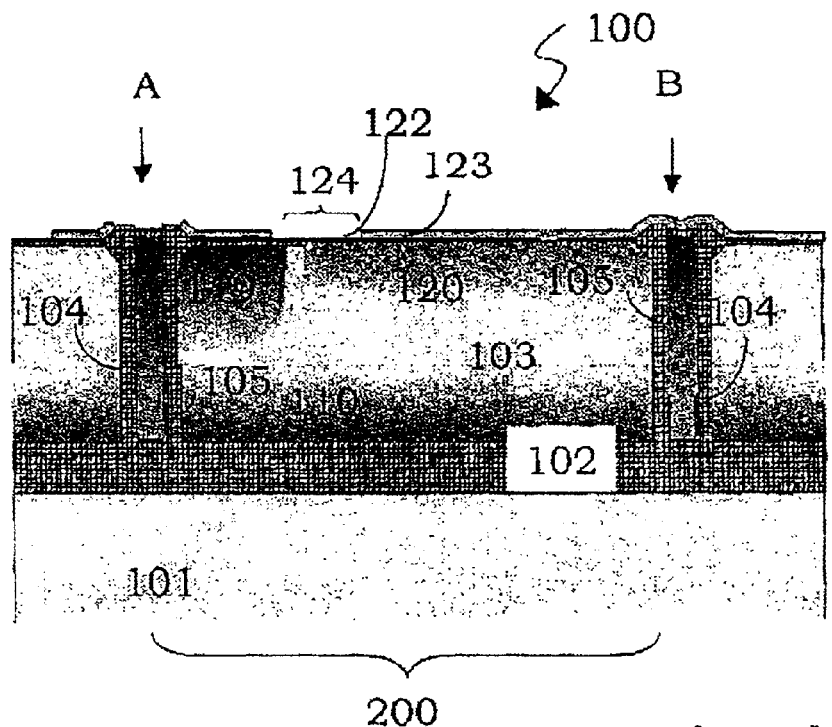
Figure 10Q:
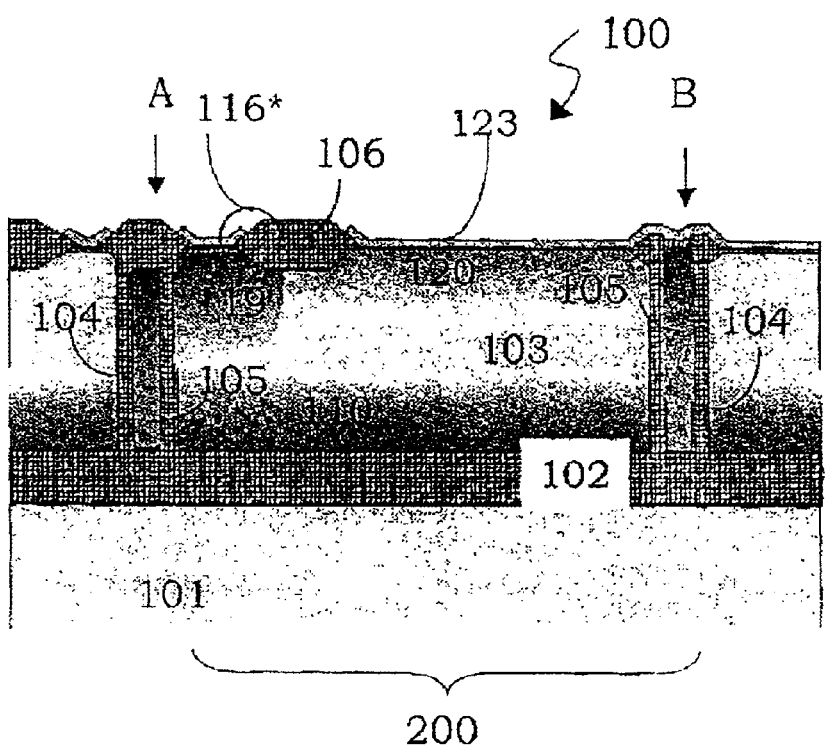
Figure 10R:
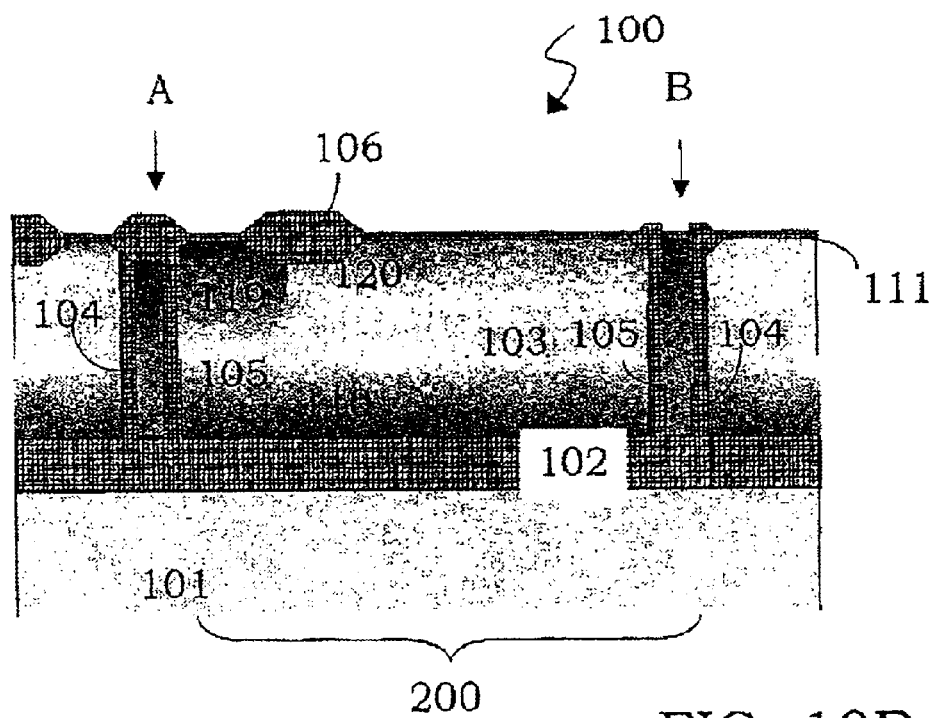
Figure 10S:
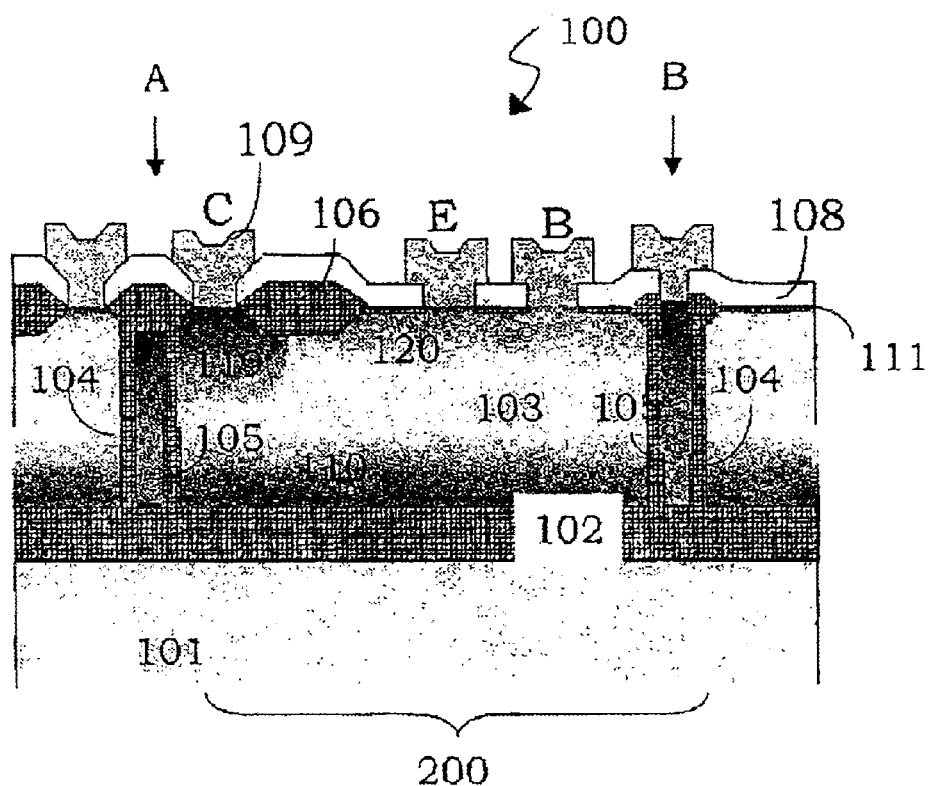

The example shown in FIGS. 10A to 10S comprises a semiconductor device 100 having first A and second B differently constructed dielectric trenches. In particular, the first trench A has a polysilicon filling material 105 that is isolated from the surface of the semiconductor device 100 by a thick oxide region 106, and the second trench B is contacted by the surface of the semiconductor device 100. Advantageously according to the invention, the above-described process allows either of the above-mentioned trench structures to be produced as appropriate to meet individual application requirements.

The process according to the invention is continued through an anisotropic step of dry etching the combination of the hardmask nitride layer 112 and the pad oxide layer 111 (as shown schematically in FIG. 10D). The trenches 104 are then formed once the resist layer 113 is removed.

In particular, the step of forming the trenches 104 comprises anisotropically etching the silicon SOI substrate 103 down to the buried layer 110 (as shown schematically in FIG. 10E).

It should be noted that, advantageously in this invention, no significant etching of the buried oxide layer 102 would occur during the etching step of the silicon of the SOI substrate 103 because the selectivity of silicon etching is much higher than oxide etching (greater than 100:1)

Furthermore, the thickness of the nitride layer 112 will be diminished only marginally because of the selectivity of silicon etching being higher than nitride etching (approximately 90:1). Accordingly, the nitride layer 112 can be used as a hardmask with no need of providing any great nitride thickness. In particular, the thickness of this layer will be retained, after the etching step, to a sufficient degree for reuse during further processing (as shown schematically in FIGS. 11A and 11B, to be described in greater detail).

Once the dielectric trench 104 is formed, the process continues through an oxidizing step (to about 4000 to 5000 Å in a preferred embodiment), which also affects the sidewalls 114 of the dielectric trench 104 (as shown schematically in FIG. 10F).

It should be noted that the oxidizing step of both walls 114 would not cause the trench 104 to be plugged dielectrically, by virtue of the width of the photolithographic opening of the dielectric trench 104. Advantageously in this invention, the stressing effects can thus be attenuated in the SOI substrate 103.

Also, the presence of the nitride layer 112 over the surface of the semiconductor device 100 disallows oxide growing. In practice, a thin layer 115 of oxynitride will form but it is of no harm to the performance of the semiconductor device 100.

A bird's beak structure 116, known in the art as a LOCOS (local oxidation) structure, forms near the edge of the trench 104 where the nitride layer 112 is discontinued.

Unlike the prior art sequence, the etching selectivity of the hardmask nitride layer 112 with respect to the oxide affords more versatile fabrication of the trench 104 and the dielectric isolation well 200.

The hardmask nitride layer 112 can be removed, however, if required by the peculiar requirements of structure, for example to grow a so-called sidewall oxidized layer over the silicon surface as well (as shown schematically in FIGS. 12A and 12B, to be described in greater detail), or to perform low-energy ion implantations in the silicon surface, or to deposit a dielectric layer to an even thickness onto the whole wafer (concurrently onto the surface of the semiconductor device 100 and inside the trench 104).

In the last-mentioned instance, the pad oxide layer 111 may also be removed from the surface of the semiconductor device 100 without significantly affecting the thickness of the buried oxide layer 102. In fact, since the pad oxide layer 111 is very thin, a reduction in the thickness of the buried oxide layer 102, in consequence of the layer 111 etching, would prove trivial even with technologies which utilize SOI substrates having a thin buried oxide layer 102.

The above approach may be applied, for example, to a buried oxide obtained by the SIMOX technique, wherein the thickness of the buried oxide layer 102 would be on the order of a few thousand Ångströms.

On the other hand, according to the prior art process sequence, forming the trench insulating structure after the field oxide is defined requires that the thickness of the field oxide layer be preserved, as by means of a dedicated nitride layer, throughout the etching steps for forming the trench.

The process according to the invention further comprises a step of filling the dielectric trench 104 by depositing a polysilicon filling material 105 onto the entire surface of the semiconductor device 100 (as shown schematically in FIGS. 10G).

It should be noted that the thickness of the polysilicon filling material 105 should be adequate to plug up the trench 104. In a preferred embodiment, the polysilicon filling material 105 has a thickness of approximately 7000 to 8000 Å.

A step of planarizing the surface of the semiconductor device 100 is then carried out by etching back the polysilicon filling material 105. The etchback comprises, as one skilled in the art would know, a first isotropic sub-step carried out as wet etching for removing the LOCOS structure 116 left on top of the trench 104 by the amorphous silicon deposition, and a second anisotropic endpoint sub-step carried out as dry etching (followed by an overetching step) on the underlying nitride layer 112 (as shown schematically in FIG. 10H).

In practice, the nitride layer 112 will be covered with a thin layer 115 of oxynitride from a previous sidewall oxidizing step, for example. However, the oxynitride of the layer 115 has a selectivity greater than 10:1 with respect to the polysilicon etchback, and is not a problem to this etching step.

The integration process continues through a step of coating the surface of the semiconductor device 100 with a protective resist layer, and a step of dry etching away the polysilicon on the wafer back side, known as back-etch.

The back-etching step is followed by a step of removing the combination of the nitride layer 112 and the underlying pad oxide layer 111 by wet etching, and an oxidizing step to form a thin surface oxide layer 117 (as shown schematically in FIG. 10I) to act as pre-implantation oxide for subsequent implantations.

It would be possible to only remove the hardmask nitride layer 112, in which case the oxidizing step would be unnecessary.

For the instance under consideration of a semiconductor device 100 being fabricated with BiCMOS technology, the integration process according to the invention would further comprise a plurality of masking (deposition and development of a resist layer), implanting, and annealing steps directed to integrate sinker layers of the n and p types where required for forming the various components.

During any of these steps, the polysilicon filling material 105 of the trench 104 may be doped with the same (n- or p-type) dopant as is used for integrating the sinker layers. The polysilicon filling material 105 may be formed in situ during the deposition process.

With technologies, such as MOS technologies, that do not require sinker layers, but require enhancement of the polysilicon filling material 105 of the dielectric trench 104, indeed, the planarizing or etching back step may be followed by another oxidizing step of the pre-implantation oxide layer 117, and an enhancement implanting step carried out over the entire surface of the semiconductor device 100 with a dopant which will advantageously be self-aligned to the regions of the trench 104 by virtue of the LOCOS structure 116 provided (as shown schematically in FIG. 10L).

Self-alignment of the enhancement dopant for the polysilicon 105 inside the trench 104 is an inherent feature to the process according to the invention due to the provision of the nitride layer 112 around the trench and the underlying bird's beak structure 116 near the surface of the trench 104.

In the instance of integration with BiCMOS technologies, if the energy of the enhancement implantation disallows use of the hardmask nitride layer 112, or if a screen formed from the nitride layer 112 is critical to potential overflowing of the dopant outside the trench 104, or if the hardmask nitride layer 112 has been removed directly after the polysilicon back-etching step, then the enhancement dopant used in the integration process according to the invention would be also self-aligned to the trench 104 by virtue of the LOCOS structure 116 surrounding the trench 104. In this case, it will suffice to set a masking resist layer 118, provided to define convenient openings C at deep enhanced regions or sinker layers 119, back from the bird's beak of the LOCOS structure 116 (as shown schematically in FIG. 10M).

Specifically in the instance of integration technologies whereby bipolar (e.g,. BiCMOS) components are integrated, the process sequence described so far would exhibit another favorable feature, i.e., self-alignment of the sinker layers 119 with respect to the trench 104. In particular, self-alignment is achieved by removing the masking resist layer 118 around the trench 104 from the side of the well 200 where the sinker layer 119 is to be integrated (as shown schematically in FIG. 10N).

Under such conditions, self-alignment of the deep sinker layers advantageously allows the structure of an integrated component to be kept most compact.

After the sinker layers 119 and before defining the active areas of the components, additional masking, implanting and annealing steps may be carried out in order to provide p-well and n-well layers wherever required for integrating complementary bipolar or unipolar components.

Advantageously according to the invention, these layers would be integrated before the active area is defined, so that aligned structures to the trench 104 bordering the isolation well 200 can be obtained which are unaffected by the required alignment to subsequently define a LOCOS structure 116* related to the active area.

Shown in FIG. 10O by way of example is the integration of a p-well type of well 120, carried out before the active areas of the components are defined but after the sinker layer 119 is formed, using an additional masking layer 121.

By having the layers defined before the active areas self-aligned independently of those defined afterward, greater versatility is obtained for the integration of components inside the isolation well 200 produced by the process of this invention, as explained hereinafter.

The process of this invention comprises in this case a step of defining active areas of components, e.g., using a conventional LOCOS technique, subsequent to a step of defining p-well and n-well layers by photomasking, implanting and annealing steps. This active area defining step provides for removing the previously formed layer 117 of pre-implantation oxide, growing another thin oxide layer 122 (approximately 200 to 300 Å thick in a preferred embodiment), also known as pad oxide; depositing a nitride layer 123 (approximately 600 to 700 Å thick in a preferred embodiment); and photomasking and etching the nitride layer 123 at the locations of so-called field regions 124 (as shown schematically in FIG. 10P).

During the masking process, the nitride layer 123 is not removed from over the trenches 104 where the polysilicon filling material 105 is to be contacted, so as to prevent growth of the field oxide 106. It should be noted that an advantage of this invention is that, during the contact patterning step, the whole surface of the trench 104 has the same degree of planarity as the active regions.

The integration process according to the invention is then continued through an oxidizing step (to a thickness of about 6000 to 7000 Å in a preferred embodiment), whereby a layer 106 of field oxide is formed over the regions 124 from which the nitride layer 123 has been removed (as shown schematically in FIG. 10Q).

After the active area is defined as above, the process is carried on conventionally to form surface layers for use in forming various (unipolar or bipolar) components. In particular, the following steps are carried out:

jointly removing the nitride layer 123 and thin pad oxide layer 122, and growing and removing a sacrificial oxide (approximately 200 to 300 Å thick in a preferred embodiment), as shown schematically in FIG. 10R;

growing a gate oxide (to a thickness of about 70 to 150 Å in a preferred embodiment), and depositing a polysilicon layer (to a thickness of about 3000 to 4000 Å in a preferred embodiment) in view of forming a gate terminal for unipolar components;

depositing a dielectric layer (to a thickness of about 3000 to 4000 Å in a preferred embodiment) in view of having a spacer formed; and defining all the other layers required for integrating the structures of various components (as shown schematically in FIG. 10S for body, base, source, drain, and emitter regions).

It should be noted that, once the above process is completed, the surface layers will either be self-aligned along the peripheral regions of the well 200 by virtue of the bird's beak LOCOS structure 116*, or be aligned in the internal regions created with the photoresist masking layer 118, according to necessity.

Furthermore, it can be appreciated that having the layers, defined ahead of the active area, self-aligned independently of the layers, defined alter the active area, affords a more versatile integration of components within the isolation well 200.

The bird's beak structures that form around the trench 104 during the sidewall oxidizing step, as well as during the field oxidizing step, set a minimum distance between the layers self-aligned to them and the side dielectric of the trench 104.

In particular, since the self-aligned layers by the LOCOS structure 116 created during the sidewall oxidizing step are bulk layers, and hence deeper and more diffused than the technology (sinker, p-well, n-well), the dopant will diffuse laterally farther than the minimum distance dictated by self-alignment, and therefore contact the sidewall oxide of the trench 104 directly, thus preventing pn surface junctions from forming near the trench 104.

It should be considered in this respect that the presence of a surface p-well beside the trench 104 leads to the appearance of a pn surface junction due to the intermediate n layer which separates it from the trench 104 (pn surface junction). In this case, the depletion of this pn surface junction would come in direct contact with the trench 104.

Advantageously according to the invention, a direct contact of the dopant side diffusion with the sidewall oxide of the trench 104 prevents the depleted regions of the pn surface junctions from contacting the walls 114 of the trench 104 and cause potential leakage phenomena. For example, as shown schematically in FIG. 10O, the p-well layer 120 is in direct contact with the trench B, thus preventing the formation of pn surface junctions.

This layer 120 forms a pn bulk junction, whose depletion does not affect the surface regions.

In the instance of the layers self-aligned by the LOCOS structure 116* created during the field oxidizing step, since these are the layers where the surface structures of the components, and hence the thin and shallow-diffused layers of the technology (bases, emitters, sources, drains, enhancements), are formed, the dopant will diffuse laterally less than the minimum distance dictated by the self-alignment LOCOS structure 116*. Thus, pn surface junctions are formed whose depleted regions may cause leakage phenomena.

Advantageously according to the invention, by having the bulk layer integrated independently of the surface layers, electrical continuity of the surface layer dopant to the trench is ensured. It will suffice for the purpose to preliminarily integrate, where necessary, at the expected interspace surface junction which might form subsequently to the field oxide realization, a portion of a bulk layer doped with the same sign as the surface layer dopant and extending far enough to ensure electrical continuity between the two layers.

The well 200, being insulated dielectrically by the trenches 104, is thus specially versatile and adapted to produce voltage-bearing edge structures for the devices, or for all those structures which usually enter the fabrication of devices which requires on one or more operating high voltages (as VDMOS, MOS-drift, etc.).

After completing the structures for the various components, the integration process according to the invention provides a depositing step of a dielectric insulating layer 108, in this case VAPOX (of approximately 3000 Å), which is necessary to have the various components conventionally isolated from one another.

The integration process is completed by a step of uncovering the contact regions (including trenches 104 for which metal contacts are desired, as in the case of trench B), and a conventional sequence of steps are then carried out to complete the integration of the remaining surface layers, such as metallization, insulating dielectrics, and passivants (as shown schematically in FIG. 10S).

The integration of the semiconductor device 100 according to the BiCMOS technology, and provided with dielectric insulation according to the invention, is thus complete.

It should be noted that the semiconductor device 100, obtained with the integration process according to the invention and shown schematically in FIG. 10S, includes a buried layer 102 of the n type, since an npn bipolar component has been taken to exemplify a device integration in the well.

In a more general way, buried layers of n- or p-type may be formed inside the isolation well 200, according to the types of the devices to be integrated in the well 200. These buried layers may provide, for example, collector and/or drain regions respectively for bipolar and unipolar components.

Buried layers, of p- or n-type, may also be formed during fabrication of the SOI substrate 103, either by carrying out an initial implanting step affecting the entire surface of the device-wafer back side, before the bonding process, or by masking, implanting, and annealing the surface of the device-wafer, followed by epitaxial growth. These conventional processes are also applicable to relatively thin SOI substrates.

Advantageously according to the invention, an alternative embodiment of the isolation well 200, having the same structural features, comprises a single nitride layer, serving as a hardmask layer to form the trench as well as to define the active areas of the components.

Figure 11A:
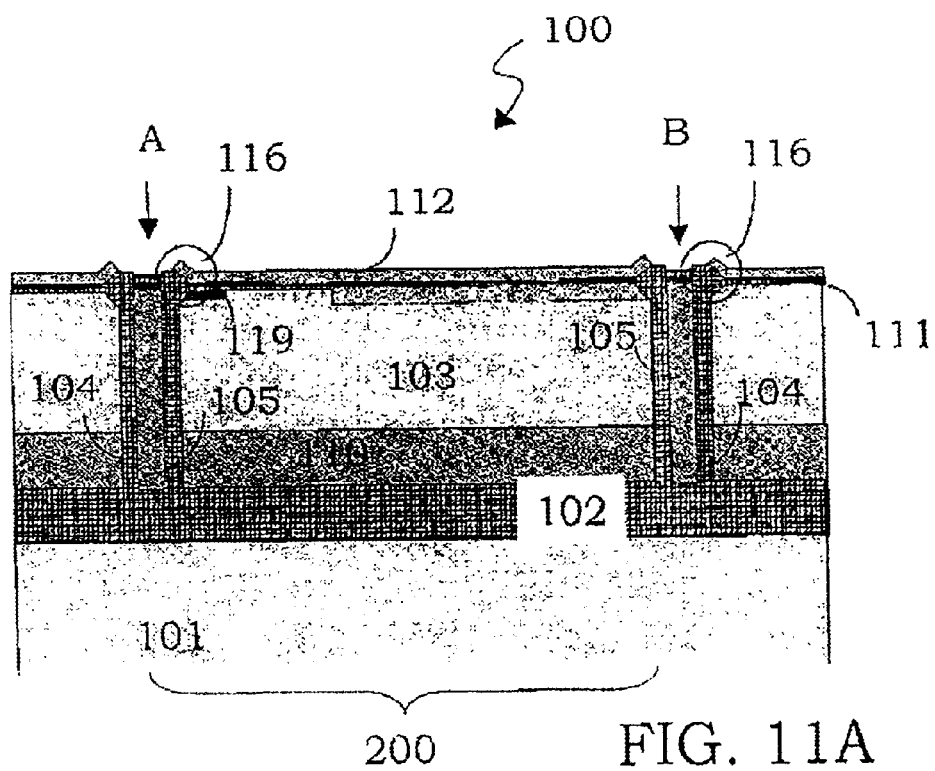
FIGS. 11A and 11B show schematically the device of FIG. 9 at different stages of an alternative embodiment of its fabrication process, according to the invention.
Figure 11B:
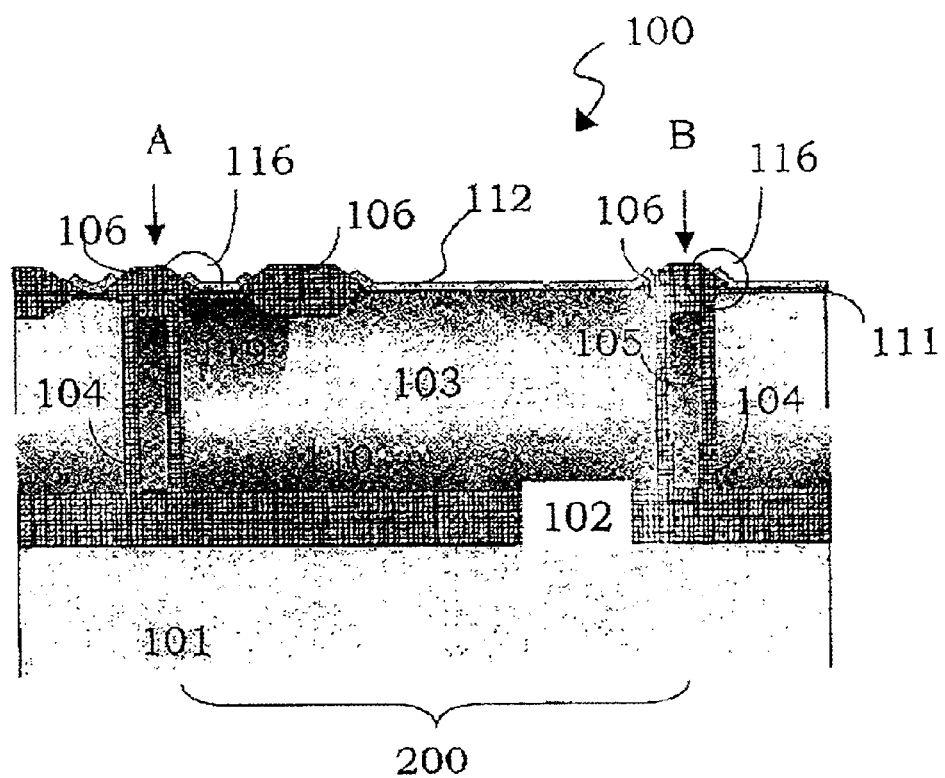

This alternative embodiment is shown schematically in FIGS. 11A and 11B.

A semiconductor device 100 has been considered for these Figures, as it appears after the polysilicon etching back step (shown schematically in FIG. 10H).

In this alternative embodiment of the process according to the invention, the combination of the nitride layer 112 and the pad oxide layer 111 is not removed (as shown schematically in FIG. 11A). Accordingly, the polysilicon filling material 105 of the trench 104 is doped directly using the same dopant as in defining the sinker regions 119, as previously described.

The presence of residual hardmask nitride layer 112 all over the surface of the semiconductor device 100 requires that the implantations for defining the sinker regions 119, as well as the p-well and n-well layers, be formed at a slightly higher energy.

The sinker regions 119 may be integrated, if desired, by removing the nitride layer 112 in a masking and etching step, since the high dosage used in forming the layers, at the higher implanting energy needed to go through the nitride layer 112, may limit the development of the implanting step.

Because of the hardmask nitride layer 112 being also used for defining the active areas of the components, removal of the nitride layer 112 from the sinker regions 119 results in the field oxide 106 being grown thereon. In actual practice, this will not affect the performance of integrated devices thus fabricated, since the sinker regions 119 would be separated from the active regions by the field oxide itself.

The foregoing also applies to the surfaces of the trenches 104, where the absence of a second nitride layer for defining the contact regions results now in the field oxide layer 106 being grown (as shown schematically in FIG. 11B).

In this case, before defining the insulating surface dielectric of the components, a photomasking and etching process must be carried out to remove the thick oxide layer 106 such that contacts are opened in the sinker regions 119 and in the polysilicon filling material 105 of the trench 104.

The remainder of the process sequence is as previously described, up to completion of the structure.

Figure 12A:
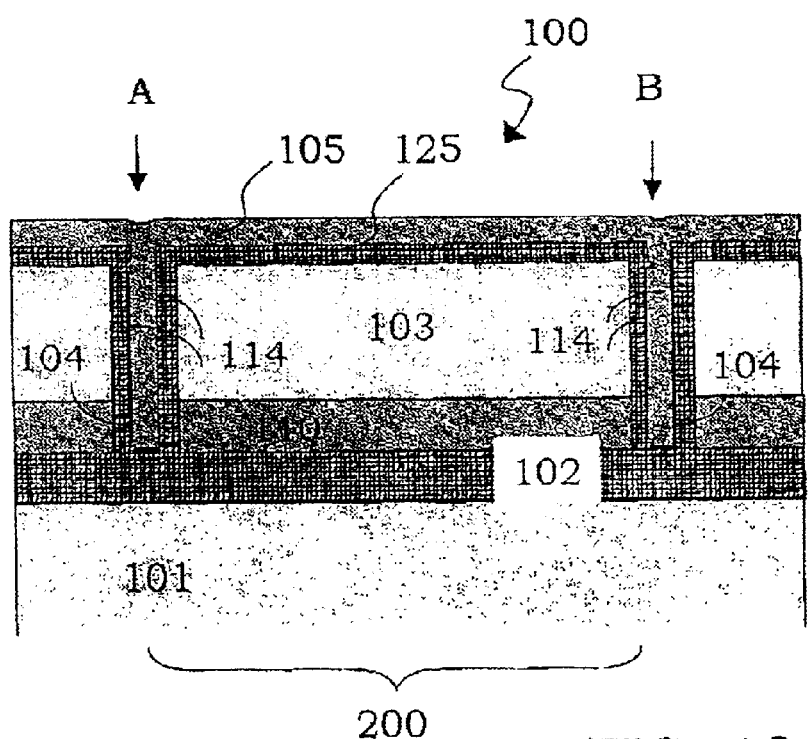
FIGS. 12A and 12B show schematically the device of FIG. 9 at different stages of another alternative embodiment of its fabrication process, according to the invention.
Figure 12B:
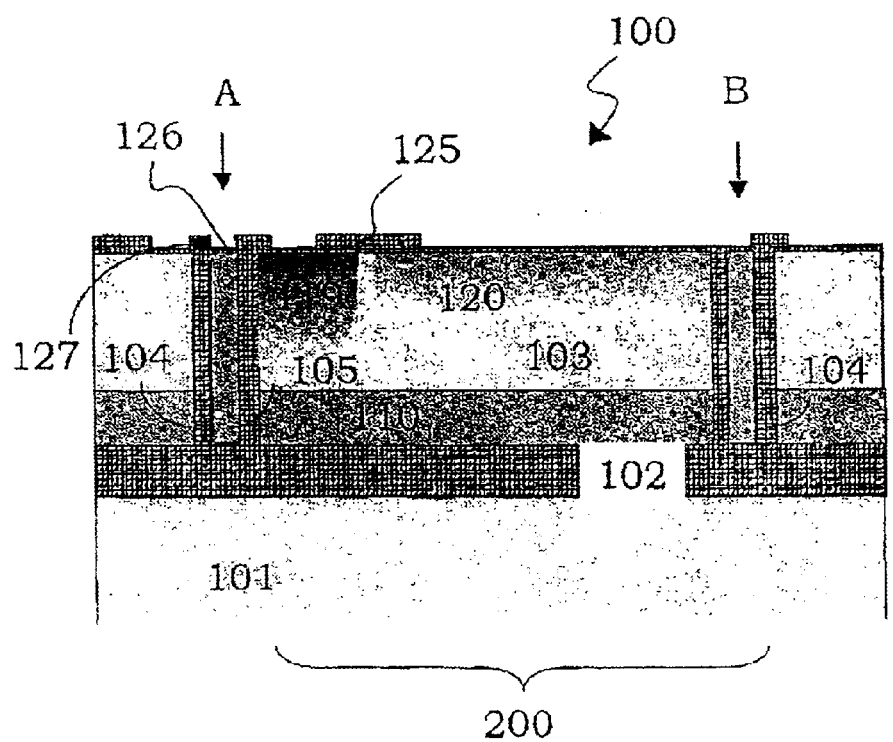

Advantageously according to the invention, another alternative embodiment of the isolation well 200 is as shown schematically in FIGS. 12A and 12B.

Here again, a single nitride layer 112 is used, but this layer is removed immediately after defining the trench 104. In this case, the underlying thin pad oxide layer 111 may also be removed.

In particular, a semiconductor device 100 has been considered for FIGS. 12A and 12B, as it appears after the trench etching step (shown schematically in FIG. 10E).

According to this alternative embodiment, the integration process of the invention includes a step of removing the nitride layer 112 (optionally, the pad oxide layer 111 as well), and an oxidizing step (to a thickness of about 4000 to 5000 Å in a preferred embodiment) which also affects the sidewalls 114 of the trench 104. It should be noted that the absence of a nitride layer 112 results in an oxide layer 125 being grown also on the surface of the semiconductor device 100.

Thereafter, a depositing step of the polysilicon filling material 105 in the trench 104 (as shown schematically in FIG. 12A), and a planarizing step to remove the polysilicon from the wafer surface, are carried out.

For example, this planarizing step may be an endpoint planarizing step carried out on the underlying oxide layer 125 and followed by overetching to set back the polysilicon 105 as far as the silicon/oxide interface.

A pre-implantation oxidizing step is then carried out (to a thickness of about 200 to 300 Å in a preferred embodiment) to have a pre-implantation oxide 126 grow on just the polysilicon filling material 105 of the trench 104 (where desired), not on the remaining surface of the semiconductor device 100 where the presence of an oxide layer 125 of substantial thickness would prevent any growth of significance.

Advantageously according to the invention, in the instance of a semiconductor device 100 being integrated with MOS technology, just as assumed hereinabove, the polysilicon filling material 105 may be enhanced by implantation of the semiconductor device 100 throughout, the substantial thickness of the oxide layer 125 covering the whole surface (but for the trench 104 where the polysilicon filling material 105 would be exposed) and allowing the polysilicon 105 inside the trench 104 to be doped in a self-aligned manner.

The polysilicon 105 would be doped as previously described (e.g., at the same time as the sinker regions 119 are integrated) even in the more general case of BiCMOS integration technologies. The active areas of the components are then defined by means of a masking and etching process directed to remove the thick oxide layer 125 from the surface of the semiconductor device 100. The p-well and n-well layers are then integrated (as shown schematically in FIG. 12B).

From now on, the process sequence is the same as previously described, up to completion of the semiconductor device 100.

A major difference in the semiconductor device 100 having a trench insulating structure, as formed by said another alternative embodiment of the integration process according to the invention, is a lesser degree of surface planarity of the semiconductor device 100, which is due to the absence of a nitride layer for defining the active area (and absence, therefore, of the conventional LOCOS technique). The isolation well 200 is made more compact, though, by the absence of bird's beak structures all around the periphery of the trench 104, the layers from which the component structures are formed being aligned by the simple expedient of using a photoresist masking layer.

Advantageously according to the invention, the p-well and n-well layers are, differently from before, formed after the active area is defined, and by reason of the LOCOS structures being missing, self-alignment of the bulk layers will not be naturally independent of the surface layers. A degree of independence may yet be established between said layers, if necessary, by masking with an appropriate resist layer during the doping step.

Furthermore, for electrical continuity to exist from the p-type bulk layers to the dielectric trench 104 (e.g., the p-well, so as to avoid pn surface junctions toward the trench), a portion 127 of the thick field oxide 106 should be removed locally from the trench 104 side lying within the isolation well 200, during the active area definition (as shown schematically in FIG. 12B for trench B).

Figure 13A:
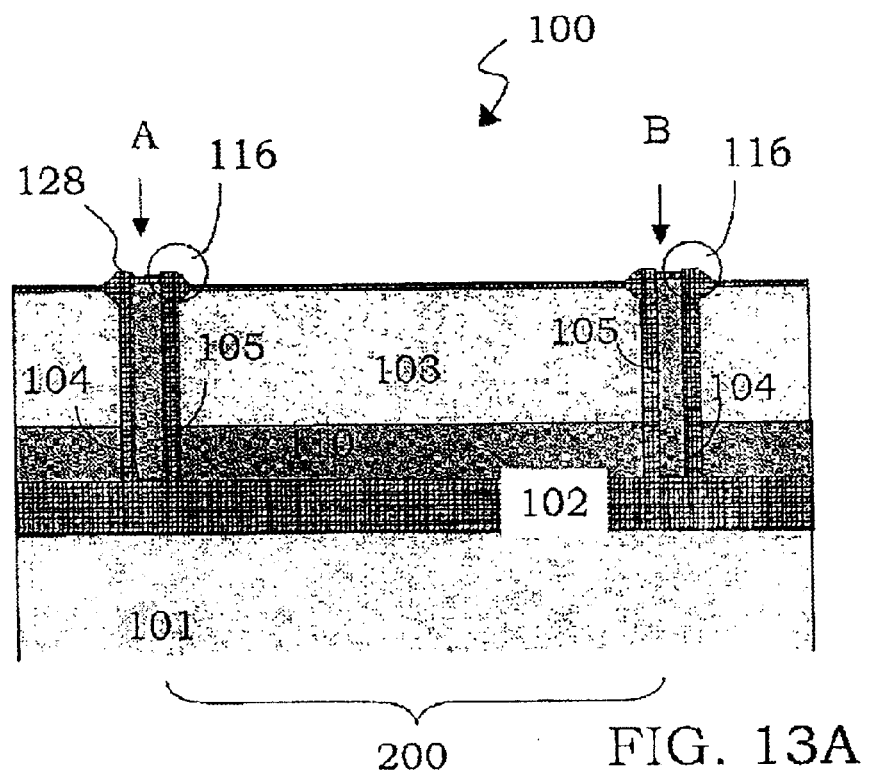
FIGS. 13A and 13B show schematically the device of FIG. 9 at different stages of a further alternative embodiment of its fabrication process, according to the invention.
Figure 13B:
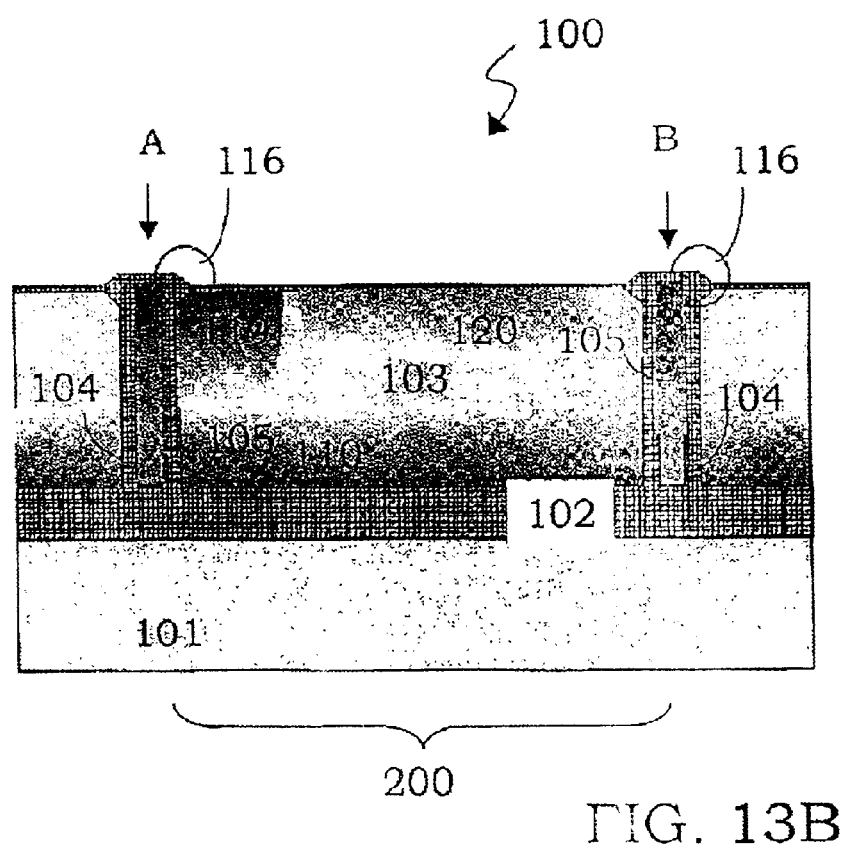

A further alternative embodiment of the isolation well 200 may be provided as shown schematically in FIGS. 13A and 13B.

This alternative embodiment also uses a single nitride layer, but allows self-alignment of the bulk layers to be independent of the surface layers in an inherent manner to the structure. In this case, the field oxidizing step provided in the previous alternative embodiment of the integration process according to the invention can be omitted.

A semiconductor device 100 is considered as it appears after the trench etching step (shown schematically in FIG. 10H).

According to this alternative embodiment of the process of the invention, an oxidizing step is carried out to form a thin oxide layer 128 on the surface of the polysilicon filling material 105 of the trench 104, followed by a step of removing the hardmask nitride layer 112 (as shown schematically in FIG. 13A).

This alternative embodiment of the process according to the invention further comprises a step of doping the polysilicon filling material 105 of the trench 104, a step of integrating the bulk layers (as shown schematically in FIG. 13B), and a step of integrating the remaining surface layers as previously discussed.

It should be noted that the absence of a field oxide layer 106 causes no structural problems because the side insulation, provided by the dielectric trenches 104 and the LOCOS structure 116 around the latter, is adequate to ensure both dielectric insulation and good performance of the components inside the well 200. In this case, the active area of the semiconductor device 100 would be substantially coincident with the area bordered by the trenches 104.

Furthermore, no problems are posed by the absence of a thick oxide layer 106 from the isolation region between the bases and the collectors of bipolar components, and between the bodies and the drains of VDMOS components, (which region would be defined by a thick oxide layer in known devices as well), on account of the insulating dielectric integrated during the contact-forming step, especially where low-voltage components are involved.

Figure 14A:
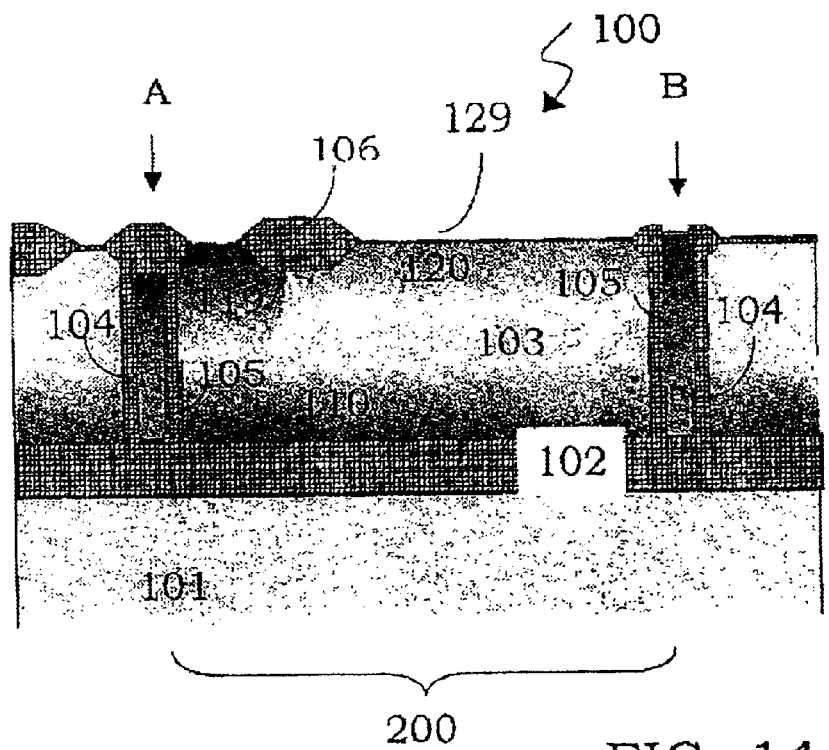
FIGS. 14A and 14B show schematically the device of FIG. 9 at different stages of still another alternative embodiment of its fabrication process, according to the invention.
Figure 14B:
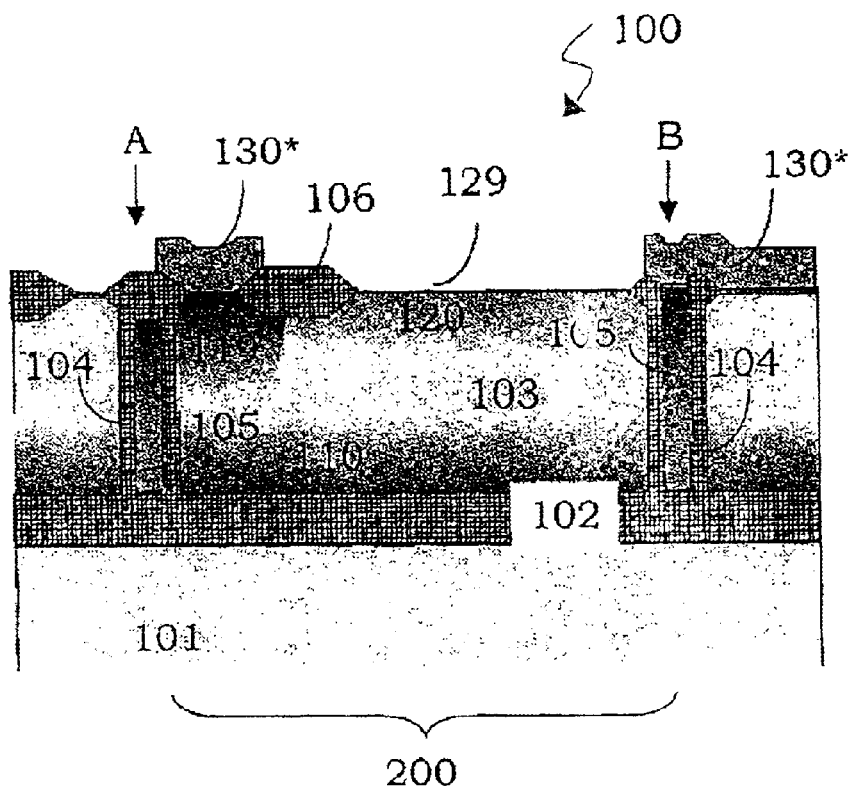

FIGS. 14A and 14B illustrate, by way of non-limitative example, the versatility of the structure of the isolation well 200 according to the invention. In particular, a connection between the polysilicon layer, from which the gate terminals of unipolar components are to be formed, and the polysilicon filling material layer 105 of the trench, or to regions inside the isolation well 200, is provided.

It should be noted that the gate polysilicon layer may also be utilized to provide component interconnecting tracks between wells.

A semiconductor device 100 has been considered as it appears after the field oxide layer 106 is formed (shown schematically in FIG. 10Q). The process according to the invention comprises a step of removing the combination of the nitride layer 112 and the underlying pad oxide layer 111.

A step of growing and removing a sacrificial oxide, a step of growing a gate oxide 129, and a step of masking and etching away such a gate oxide 129 from regions of interest, e.g., the interior of the well 200 and/or the polysilicon filling material 105, are then carried out (as shown schematically in FIG. 14A).

At this stage, a depositing step of a polysilicon layer 130 is carried out in order to define the structures of the gate terminals for unipolar components, the gate polysilicon layer 130 also serving as an interconnect layer to connect the various integrated structures to each other.

It is known to dope the gate polysilicon layer 130 in situ, either during the depositing step itself or concurrently with subsequent enhancement implantations to be effected in order to define the emitter and source regions of the components integrated to the semiconductor device 100.

In fabricating the semiconductor device 100 shown in FIGS. 14A and 14B, it is expedient to preliminarily enhance using dopant (of p- or n-type) the areas of contact of the gate polysilicon layer 130 with the silicon of the semiconductor device 100, so as to lower their contact resistance. The dopants employed to define the sinker regions 119, or a dedicated masking and implanting step, or an implanting step already provided by the process, may be used for this conventional operation.

The gate polysilicon layer 130 is then etched (using an additional masking and etching step) away from regions of no interest (as shown schematically in FIG. 14B).

Finally, the resulting polysilicon regions 130* are insulated dielectrically by means of an oxidizing step directed to provide an oxide layer, useful as a pre-implantation oxide for forming the next layers.

It should be noted that the semiconductor device 100 shown in FIG. 14B has a contact formed between the gate polysilicon layer 130 and a region inside the well 200, such as the sinker layer 119, as well as to the polysilicon filling material 105 of trench B. If required, other structures may be similarly contacted.

This alternative embodiment merely requires an additional masking step, and is quite effective in the design of resistant devices to ionizing radiation. By biasing the polysilicon filling material 105 and/or the polysilicon on regions contacting the interior of the well 200, any parasitic components (parasitic MOS along surface channels, leakage between contiguous wells, breakdown instability, etc.), due to the effect of ionizing radiation can be cut off.

For simplicity, no detailed description of conventional process steps directed to prevent development of flaws, such as the growth of pre-implantation oxides and sacrificial oxides, has been included in the foregoing description of the different processing steps. It should be understood, however, that such expedients may also find use in the process according to the invention, where required.

Also, the process steps described hereinabove in connection with the process according to the invention and its alternative embodiments may be variously combined to produce other structures for the well 200.

To summarize, the above description of the integration process according to the invention and alternative embodiments thereof brings out that the isolation well 200 formed in accordance with the invention can admit of any process and/or structure variations or integrations.

In general, it will be appreciated that any structural changes required for specific applications can be introduced at any stage of the process sequence, without unduly disarranging the process sequence or adding complicated process steps.

These advantageous features are mainly due to the use of the nitride layer 112 as a hardmask, and to the integration of the trench 104 before the active areas of the components of the semiconductor device 100 are defined.

Both these features, additionally to making for a highly adaptable isolation well 200 to any changes in the process, bring about such benefits as self-alignment of the dopant employed to enhance the polysilicon filling material 105 of the trench 104 and natural decoupling of the integration of the bulk layers of the components from the surface structures, thereby improving the versatility of the isolation well 200 and its adaptability to the integration of more complex structures and alternative embodiments.

Lastly, the process according to the invention allows an isolation well to be formed by means of a sequence of steps which is much more simple and cost-effective than the conventional one. For the purpose, in the process according to the invention, the trenches 104 are formed ahead of the field oxide 106, and a nitride layer grown over the pad oxide layer 111 as hardmask is used in such a way to overcome the problem posed by the buried oxide layer 102 being etched away when the hardmask is removed.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. An integration process in a SOI substrate of a semiconductor device including at least a dielectrically insulated well, the process comprising:
   an oxidizing step directed to form an oxide layer;
   a depositing step of a nitride layer onto said oxide layer; and
   a masking step, carried out onto said nitride layer using a resist layer and directed to define photolithographic openings for forming at least one dielectric trench effective to provide side insulation for said well;
   an etching step of said nitride layer and said oxide layer, as masked by said resist layer, said nitride layer used as a hardmask;
   a step of forming said at least one dielectric trench and comprising at least one etching step of said substrate, an oxidizing step of at least sidewalls of said at least one dielectric trench, said oxidizing step producing a plurality of bird's beak structures at the edges of said at least one dielectric trench where said nitride layer is discontinued, and a filling step of said at least one trench with a filling material;
   a step of forming active areas for components to be integrated in said well, being carried out after said step of forming said at least one dielectric trench; and
   planarizing the surface of said semiconductor device by removing said plurality of bird's beak structures and etching back said filling material.

2. The integration process of claim 1 wherein said oxidizing step of said sidewalls of said at least one dielectric trench does not plug the at least one dielectric trench dielectrically, and that said nitride layer on the surface of said semiconductor device prevents oxide from being grown during said oxidizing step.

3. The integration process of claim 1, further comprising a step of removing said hardmask nitride layer, and a further step of growing an oxidation layer on the surface of said semiconductor device.

4. The integration process of claim 3, comprising a further step of removing said oxide layer.

5. The integration process of claim 1 wherein said oxidizing step places said walls of said trench in direct contact with at least one doped surface layer.

6. The integration process of claim 1 wherein a filling material is used, during said step of filling said at least one trench, said filling material having a sufficient thickness to plug up said at least one dielectric trench.

7. The integration process of claim 1, further comprising a step of doping said filling material.

8. The integration process of claim 7 wherein said doping step is carried out during a step of implanting at least one implanted layer needed to form components to be integrated in said well.

9. The integration process of claim 7 wherein said doping step is carried out in situ during said filling step.

10. The integration process of claim 7 wherein said doping step comprises a further oxidizing stop of a pre-implantation oxide layer, and an enhancement implanting step carried out on the entire surface of said semiconductor device.

11. The integration process of claim 1, further comprising a step of forming sinker layers in said well.

12. The integration process of claim 11 wherein said step of forming sinker layers comprises at least one masking step of said well, carried out using a masking resist layer to define openings at the locations of said sinker layers, followed by an implanting step.

13. The integration process of claim 12 wherein said masking resist layer is set back from said bird's beak structures.

14. The integration process of claim 12 wherein said masking resist layer is removed from around said at least one oxidized trench on said well side.

15. The integration process of claim 1, further comprising masking, implanting, and annealing steps directed to produce doped layers before forming the active areas.

16. The integration process of claim 1 wherein said active area forming step comprises at least one depositing step of an additional nitride layer, and a step of photomasking and etching said additional nitride layer at the locations of field regions.

17. The integration process of claim 16 wherein said further nitride layer is removed from said at least one trench to isolate said filling material.

18. The integration process of claim 16 wherein said additional nitride layer is not removed from said at least one trench, thereby establishing a contact to said filling material.

19. The integration process of claim 16, further comprising an oxidizing step effective to form a field oxide layer over said field regions and a second plurality of bird's beak structures at the edges of said field regions where said additional nitride layer is discontinued.

20. The integration process of claim 19 wherein said oxidizing step is preceded by a step of integrating a portion of doped layer effective to oppose formation, from said oxidizing step, of interspace surface junctions in the neighborhood of said field regions.

21. The integration process of claim 1 wherein said nitride layer is used for said active area forming step, and that it comprises at least one step of photomasking and etching said nitride layer my from sinker regions.

22. The integration process of claim 11 wherein said step of forming sinker layers comprises at least one step of masking said nitride layer in order to define openings at the locations of said sinker layers, followed by an implanting step.

23. The integration process of claim 22, further comprising a step of removing a thick oxide layer from said at least one dielectric trench.

24. The integration process of claim 1, comprising a further step of removing said nitride layer after said step of forming said at least one dielectric trench.

25. The integration process of claim 24, comprising a further step of removing said oxide layer after said further step of removing said nitride layer.

26. The integration process of claim 24 wherein said oxidizing step of said sidewalls of said at least one dielectric trench further comprises growing a further oxide layer over the surface of said semiconductor device.

27. The integration process of claim 26 wherein said active area defining step comprises a step of masking and etching said further oxide layer.

28. The integration process of claim 3, further comprising before said step of removing said hardmask nitride layer, an oxidizing step effective to form an oxide layer over the surface of said filling material of said at least one trench.

29. The integration process of claim 1 wherein the thickness of said nitride layer used as a hardmask is adequate to ensure performance during subsequent etching steps directed to form said at least one dielectric trench.

30. The integration process of claim 29 wherein a value of less than 4 is selected for the ratio between said nitride layer thickness used as a hardmask and an oxide layer thickness.

31. The integration process of claim 1, further comprising a step of coating the surface of said semiconductor device with a protective resist layer, and a step of backetching the back side of said semiconductor device.

32. The integration process of claim 31, further comprising a step of removing said nitride layer and said oxide layer, and an oxidizing step effective to form, on the surface of said semiconductor device, a layer of pre-implantation oxide for said step of defining active areas of components to be integrated in said well.

33. The integration process of claim 1 wherein said at least one dielectric trench is formed to contact a buried oxide layer underlying said substrate and effective to provide vertical insulation for said well.

34. The integration process of claim 33, comprising a step of forming at least a second dielectric trench providing, jointly with said at least one dielectric trench and said buried oxide layer, a trench insulating structure for said well.

35. An integration process for semiconductor devices having a dielectrically insulated well in connection with an SOI substrate, comprising:
   forming an oxide layer on the SOI substrate;
   forming a nitride layer on the oxide layer;
   forming a mask using a resist layer directly on the nitride layer to define photolithographic openings for forming at least one dielectric trench;
   etching the nitride layer and the oxide layer through the photolithographic openings with the nitride layer used as a hard mask; and
   forming at least one dielectric trench, comprising etching the SOI substrate to form the at least one dielectric trench with sidewalls; and oxidizing the sidewalls of the at least one dielectric trench;
   filling the at least one dielectric trench with a filling material and doping the filling material, the step of doping carried out during a step of implanting at least one implanted layer needed to form components to be integrated in the well; and
   coating the surface of the semiconductor device with a protective resist layer and back etching the back of the semiconductor device.

36. An integration process in a SOI substrate of a semiconductor device including at least a dielectrically insulated well, the process comprising:
   an oxidizing step directed to form an oxide layer;
   a depositing step of a nitride layer onto said oxide layer; and
   a masking step, carried out onto said nitride layer using a resist layer and directed to define photolithographic openings for forming at least one dielectric trench effective to provide side insulation for said well;
   an etching step of said nitride layer and said oxide layer, as masked by said resist layer, said nitride layer used as a hardmask;
   a step of forming said at least one dielectric trench and comprising at least one etching step of said substrate, an oxidizing step of at least sidewalls of said at least one dielectric trench, and a filling step of said at least one trench with a filling material and doping the filling material, the step of doping carried out during a step of implanting at least one implanted layer needed to form components to be integrated in the well; and
   a step of forming active areas for components to be integrated in said well, being carried out after said step of forming said at least one dielectric trench.

37. An integration process in a SOI substrate of a semiconductor device including at least a dielectrically insulated well, the process comprising:
   an oxidizing step directed to form an oxide layer;
   a depositing step of a nitride layer onto said oxide layer; and
   a masking step, carried out onto said nitride layer using a resist layer and directed to define photolithographic openings for forming at least one dielectric trench effective to provide side insulation for said well;
   an etching step of said nitride layer and said oxide layer, as masked by said resist layer, said nitride layer used as a hardmask;

a step of forming said at least one dielectric trench and comprising at least one etching step of said substrate, an oxidizing step of at least sidewalls of said at least one dielectric trench, and a filling step of said at least one trench with a filling material; and a step of forming active areas for components to be integrated in said well, being carried out after said step of forming said at least one dielectric trench, the active area forming step further comprising at least one step of depositing an additional nitride layer and a step of photomasking and etching the additional nitride layer at locations of field regions and not removing the additional nitride layer from the at least one trench to establish a contact with the filling material.

38. An integration process in a SOI substrate of a semiconductor device including at least a dielectrically insulated well, the process comprising:

an oxidizing step directed to form an oxide layer;

a depositing step of a nitride layer onto said oxide layer; and a masking step, carried out onto said nitride layer using a resist layer and directed to define photolithographic openings for forming at least one dielectric trench effective to provide side insulation for said well;

an etching step of said nitride layer and said oxide layer, as masked by said resist layer, said nitride layer used as a hardmask;

a step of forming said at least one dielectric trench and comprising at least one etching step of said substrate, an oxidizing step of at least sidewalls of said at least one dielectric trench, and a filling step of said at least one trench with a filling material; and a step of forming active areas for components to be integrated in said well, being carried out after said step of forming said at least one dielectric trench, the acting area forming step comprising at least one step of depositing an additional nitride layer and a step of photomasking and etching the additional nitride layer at locations of field regions, and an oxidizing step effective to form a field oxide layer over the field regions and a second plurality of bird's beak structures at the edges of the field regions where the additional nitride layer is discontinued, the oxidizing step preceded by a step of integrating a portion of doped layer effective to oppose formation, from the oxidizing step, of interspace surface junctions in the neighborhood of the field regions.

39. An integration process in a SOI substrate of a semiconductor device including at least a dielectrically insulated well, the process comprising:

an oxidizing step directed to form an oxide layer;

a depositing step of a nitride layer onto said oxide layer, and a masking step, carried out onto said nitride layer using a resist layer and directed to define photolithographic openings for forming at least one dielectric trench effective to provide side insulation for said well;

an etching step of said nitride layer and said oxide layer, as masked by said resist layer, said nitride layer used as a hardmask;

a step of forming said at least one dielectric trench and comprising at least one etching step of said substrate, an oxidizing step of at least sidewalls of said at least one dielectric trench, and a filling step of said at least one trench with a filling material; and a step of forming active areas for components to be integrated in said well, being carried out after said step of forming said at least one dielectric trench, the nitride layer used for said active area forming comprising at least one step of photomasking and etching said nitride layer away from sinker regions.

40. An integration process in a SOI substrate of a semiconductor device including at least a dielectrically insulated well, the process comprising:

an oxidizing step directed to form an oxide layer;

a depositing step of a nitride layer onto said oxide layer; and a masking step, carried out onto said nitride layer using a resist layer and directed to define photolithographic openings for forming at least one dielectric trench effective to provide side insulation for said well;

an etching step of said nitride layer and said oxide layer, as masked by said resist layer, said nitride layer used as a hardmask;

a step of forming said at least one dielectric trench and comprising at least one etching step of said substrate, an oxidizing step of at least sidewalls of said at least one dielectric trench, and a filling step of said at least one trench with a filling material;

forming sinker layers comprising at least one step of masking said nitride layer in order to define openings at the locations of said sinker layers, followed by an implanting step; and a step of forming active areas for components to be integrated in said well, being carried out after said step of forming said at least one dielectric trench.

41. An integration process in a SOI substrate of a semiconductor device including at least a dielectrically insulated well, the process comprising:

an oxidizing step directed to form an oxide layer;

a depositing step of a nitride layer onto said oxide layer; and a masking step, carried out onto said nitride layer using a resist layer and directed to define photolithographic openings for forming at least one dielectric trench effective to provide side insulation for said well;

an etching step of said nitride layer and said oxide layer, as masked by said resist layer, said nitride layer used as a hardmask;

a step of forming said at least one dielectric trench and comprising at least one etching step of said substrate, an oxidizing step of at least sidewalls of said at least one dielectric trench, removing a thick oxide layer from said at least one dielectric trench, and a filling step of said at least one trench with a filling material;

forming sinker layers comprising at least one step of masking said nitride layer in order to define openings at the locations of said sinker layers, followed by an implanting step; and a step of forming active areas for components to be integrated in said well, being carried out after said step of forming said at least one dielectric trench.

* * * * *

UNITED STATES PATENT AND TRADEMARK OFFICE
CERTIFICATE OF CORRECTION

PATENT NO. : 6,784,042 B2
DATED : August 31, 2004
INVENTOR(S) : Leonardi Salvatore It is certified that error appears in the above-identified patent and that said Letters Patent is hereby corrected as shown below:

Title page,
Item [74], *Attorney, Agent or Firm*, "Eisa K. Jorgenson" should read as -- Lisa K. Jorgenson --.

Column 18,
Line 46, "oxidizing stop" should read as -- oxidizing step --.

Column 19,
Line 23, "my from sinker regions." should read as -- away from sinker regions. --.

Column 21,
Line 54, "said oxide layer," should read as -- said oxide layer; --.

Column 22,
Line 7, "forming comprising" should read as -- forming step and comprising --.

Signed and Sealed this

Nineteenth Day of April, 2005

JON W. DUDAS
*Director of the United States Patent and Trademark Office*